US010880155B2

(12) United States Patent
Grindeland

(10) Patent No.: US 10,880,155 B2
(45) Date of Patent: Dec. 29, 2020

(54) SYSTEM USING REMOTE TELEMETRY UNIT HAVING A CAPACITOR BASED BACKUP POWER SYSTEM

(71) Applicant: Bruce Grindeland, Franksville, WI (US)

(72) Inventor: Bruce Grindeland, Franksville, WI (US)

(73) Assignee: ELECTRIC PUMP, INC., Des Moines, IA (US)

( * ) Notice: Subject to any disclaimer, the term of this patent is extended or adjusted under 35 U.S.C. 154(b) by 0 days.

(21) Appl. No.: 16/412,655

(22) Filed: May 15, 2019

(65) Prior Publication Data

US 2019/0356537 A1    Nov. 21, 2019

Related U.S. Application Data

(60) Provisional application No. 62/672,105, filed on May 16, 2018.

(51) Int. Cl.
| | |
|---|---|
| *G08B 21/00* | (2006.01) |
| *H04L 12/24* | (2006.01) |
| *H04L 12/26* | (2006.01) |
| *G01R 31/40* | (2020.01) |
| *F04B 51/00* | (2006.01) |
| *G01R 31/08* | (2020.01) |

(52) U.S. Cl.
CPC ......... *H04L 41/0677* (2013.01); *F04B 51/00* (2013.01); *G01R 31/08* (2013.01); *G01R 31/40* (2013.01); *H04L 41/0681* (2013.01); *H04L 43/0823* (2013.01); *F04B 2207/703* (2013.01)

(58) Field of Classification Search
CPC ............. H04L 41/0677; H04L 41/0681; H04L 43/0823; F04B 51/00; F04B 2207/703; G01R 31/08; G01R 31/40
USPC ........................................................ 340/540
See application file for complete search history.

(56) References Cited

U.S. PATENT DOCUMENTS

| | | | | |
|---|---|---|---|---|
| 6,446,014 | B1 * | 9/2002 | Ocondi ................. | E21B 43/006 702/12 |
| 8,594,851 | B1 * | 11/2013 | Smaidris ................. | G05D 9/12 137/101.19 |
| 9,041,544 | B2 * | 5/2015 | Bagasra ............... | G08B 27/005 340/657 |
| 2002/0109592 | A1 * | 8/2002 | Capano ................. | G05B 15/02 340/540 |

(Continued)

*Primary Examiner* — Kerri L McNally
*Assistant Examiner* — Thang D Tran
(74) *Attorney, Agent, or Firm* — Christopher A. Proskey; BrownWinick Law Firm

(57) ABSTRACT

A system is presented that monitors the condition of a plurality of pumps in a system of pumps using a remote telemetry unit (RTU) associated with each pump. The RTUs have a sensor configured to detect when a power failure occurs and a power backup system that includes at least one capacitor that is configured to power the RTU in response to a power failure long enough for the RTU to transmit a power failure signal to a computer system that monitors the status of the pumps. The computer system initiates a delay timer in response to receiving a power failure signal and transmits a power failure signal to a technician if a power up signal is not received within the time set by the delay timer. Using capacitors instead of batteries allows the RTU to be sealed within a container and/or a potting compound.

34 Claims, 26 Drawing Sheets

(56) References Cited

U.S. PATENT DOCUMENTS

| | | | |
|---|---|---|---|
| 2002/0147503 A1* | 10/2002 | Osburn, III | G05B 23/0221 700/9 |
| 2005/0040247 A1* | 2/2005 | Pouchak | G05D 23/1905 236/44 C |
| 2005/0040250 A1* | 2/2005 | Wruck | F24F 11/30 236/51 |
| 2007/0106525 A1* | 5/2007 | McKinney | G06Q 10/06395 705/7.41 |
| 2009/0204265 A1* | 8/2009 | Hackett | G05B 19/4185 700/284 |
| 2009/0243852 A1* | 10/2009 | Haupt | G01D 7/00 340/541 |
| 2010/0114386 A1* | 5/2010 | Fima | G01M 3/2807 700/276 |
| 2012/0044068 A1* | 2/2012 | Koeninger | B67D 7/3209 340/539.11 |
| 2012/0073670 A1* | 3/2012 | Lymberopoulos | F04B 49/03 137/2 |
| 2012/0097590 A1* | 4/2012 | Early | C02F 1/484 210/198.1 |
| 2012/0112907 A1* | 5/2012 | Flath | G06F 13/409 340/540 |
| 2013/0257623 A1* | 10/2013 | Bagasra | G01D 4/004 340/657 |
| 2014/0026969 A1* | 1/2014 | Helbig | F15B 20/004 137/2 |
| 2014/0151294 A1* | 6/2014 | Prior | C02F 9/00 210/605 |
| 2015/0240803 A1* | 8/2015 | Knight | F04B 51/00 73/168 |
| 2015/0322755 A1* | 11/2015 | Peterson | F04B 47/026 166/311 |
| 2015/0355254 A1* | 12/2015 | Rothbart | F04B 51/00 417/63 |
| 2016/0002842 A1* | 1/2016 | Dawes | D06F 39/081 137/398 |
| 2016/0359325 A1* | 12/2016 | Kawata | H02J 13/00 |
| 2018/0186656 A1* | 7/2018 | Drewniak | C02F 5/125 |
| 2018/0196399 A1* | 7/2018 | Rasekh | G06Q 10/06393 |
| 2019/0126006 A1* | 5/2019 | Rehm | A61F 5/44 |

* cited by examiner

| | | | | | |
|---|---|---|---|---|---|
| 1/31/19 5:41:25 PM | WTF Main LS | Pump 1 | ALARM | | |
| 1/31/19 5:41:18 PM | WTF Main LS | Rtu Power | ALARM | | |
| 1/17/19 10:27:09 AM | WTF Main LS | Rtu Alarms | ACK | Tony Thompson | |
| 1/17/19 10:27:04 AM | WTF Main LS | Rtu Alarms | Normal | | |
| 1/17/19 10:26:35 AM | WTF Main LS | Rtu Alarms | ACK | Mark Earles | |
| 1/17/19 10:26:10 AM | WTF Main LS | Communications | Normal | | |
| 1/17/19 10:23:52 AM | WTF Main LS | Rtu Alarms | ALARM | | |
| 1/17/19 10:23:34 AM | WTF Main LS | Rtu Alarms | Normal | | |
| 1/17/19 10:23:32 AM | WTF Main LS | Rtu Alarms | ACK | Local | |
| 1/17/19 10:22:03 AM | WTF Main LS | Rtu Alarms | ALARM | | |
| 1/17/19 10:22:02 AM | WTF Main LS | Rtu ReBoot | MSG | | |
| 1/16/19 8:01:49 AM | WTF Main LS | Communications | ACK | Tony Thompson | |
| 1/16/19 8:01:06 AM | WTF Main LS | Communications | ALARM | | |
| 1/15/19 8:34:04 PM | WTF Main LS | Pump 3 | Normal | | |

644 — 1000 — 500

SYSTEM USING REMOTE TELEMETRY UNIT HAVING A CAPACITOR BASED BACKUP POWER SYSTEM

CROSS REFERENCE TO RELATED APPLICATIONS

This application claims the benefit of U.S. Provisional Patent Application Ser. No. 62/672,105 filed on May 16, 2018, the entirety of which is incorporated herein fully by reference.

BACKGROUND

1. Field

Example embodiments relate to a system that uses a remote telemetry unit having a capacitor based backup power system and a method of reporting data alarms.

2. Description of the Related Art

A remote telemetry unit (RTU) is a device that monitors and reports events occurring at a remote site. RTUs require power to operate. As such, many conventional RTUs include a battery as a back-up power source in the event main power to the RTU is interrupted or fails. The battery enables the RTU to transmit a power loss alarm condition to a computer system which, in turn, notifies operators of the power failure alarm condition.

SUMMARY

The several problems exist with conventional RTUs having a battery backup system. First, batteries require periodic maintenance and replacement. This can be costly and cumbersome if the RTUs are numerous and/or in remote locations. Second, if the batteries are not properly maintained or replaced in time, the system will be unable to transmit the power failure alarm when needed. A power failure can be a critical condition requiring immediate action, so if the alarm notification fails, great damage can occur. Third, some batteries (for example, lead acid batteries) require ventilation. Underwriter laboratories require industrial control panels be ventilated when even a small gel-cell battery is used within the panel enclosure. This precludes using sealed enclosures which are often desired in certain control panel applications. Fourth, battery life is affected by ambient temperature. As such, battery life and capacity can both be reduced due to changes in ambient temperatures. Thus, because many RTUs are exposed to wide ranging temperature changes, it is difficult to predict the life of a battery in an RTU. With these deficiencies in mind, the inventor set out to design a new RTU having a back-up power system which does not rely on a battery. The result is a novel RTU usable in many systems, for example, systems that include pumping equipment and stations, for example, sewage/storm lifts and residential low pressure sewer (LPS) pumps.

Example embodiments relate to a system that uses a remote telemetry unit having a capacitor based backup power system and a method of reporting data alarms. In accordance with example embodiments, the system may include a remote telemetry unit having a power backup system comprised of at least one capacitor and a current charging system configured to charge the at least one capacitor. The system may further include a first computer system and/or data concentrator configured to receive a signal from the remote telemetry unit indicating a condition of the remote telemetry unit, compare the condition to a previously recorded condition, and send out an alert to a receiver.

BRIEF DESCRIPTION OF THE DRAWINGS

Example embodiments are described in detail below with reference to the attached drawing figures, wherein:

FIG. 8 is a plan view of a remote telemetry unit connected to a pump housed within a pit, the view showing an inflow and outflow of fluid to the pit, the view showing a residential application of the system wherein the housing of the remote telemetry unit attached to a residential house in a residential subdivision in a residential application for use primarily with short range communication, such as in a mesh network, with Wi-Fi, or the like;

FIG. 17 is the view of FIG. 15, with the map zoomed in;

FIG. 25 is a close-up view of a portion of the alarm log shown in FIG. 24, the view showing particular RTU power failure signals being sent to the technician and being acknowledged by the technician and then being corrected by a power-up signal being received.

DETAILED DESCRIPTION

Figure 1:
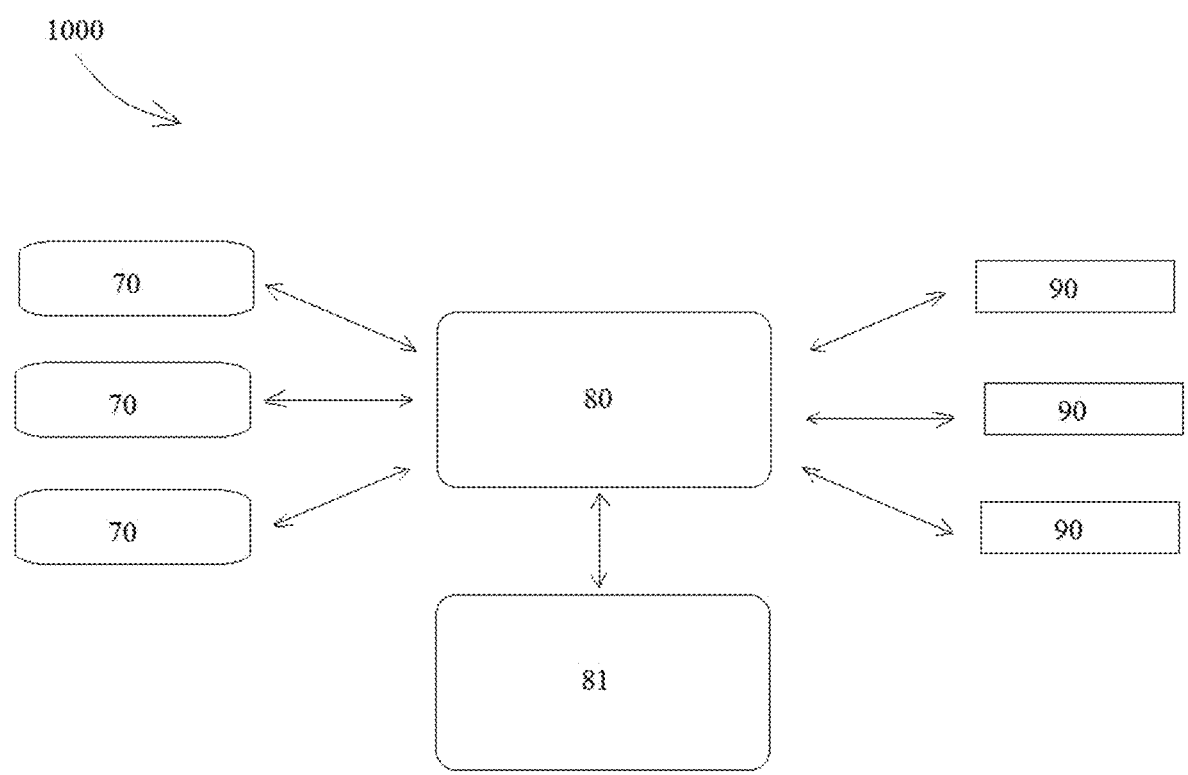
FIG. 1 is a plan schematic view of a system in accordance with example embodiments, the view showing a plurality of RTUs associated with pumps that wirelessly connect with a first computer system and/or a second computer system, the view showing the first computer system and/or second computer system connected with a plurality of receivers monitored by a technician such as a cell phone, lap top computer, desktop computer, tablet computer, or any other computing system.

Example embodiments will now be described more fully with reference to the accompanying drawings, in which example embodiments of the disclosure are shown. The disclosure may, however, be embodied in different forms and should not be construed as limited to the embodiments set forth herein. Rather, these embodiments are provided so that this disclosure will be thorough and complete, and will fully convey the scope of the disclosure to those skilled in the art. In the drawings, the sizes of components may be exaggerated for clarity.

It will be understood that when an element or layer is referred to as being "on," "connected to," or "coupled to" another element or layer, it can be directly on, connected to, or coupled to the other element or layer or intervening elements or layers that may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another elements, component, region, layer, and/or section. Thus, a first element component region, layer or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the structure in use or operation in addition to the orientation depicted in the figures. For example, if the structure in the figures is turned over, elements described as "below" or "beneath" other elements or features would then be oriented "above" the other elements or features. Thus, the exemplary term "below" can encompass both an orientation of above and below. The structure may be otherwise oriented (rotated 90 degrees or at other orientations) and the spatially relative descriptors used herein interpreted accordingly.

Embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configurations formed on the basis of manufacturing process. Therefore, regions exemplified in the figures have schematic properties and shapes of regions shown in the figures exemplify specific shapes or regions of elements, and do not limit example embodiments.

The subject matter of example embodiments, as disclosed herein, is described with specificity to meet statutory requirements. However, the description itself is not intended to limit the scope of this patent. Rather, the inventors have contemplated that the claimed subject matter might also be embodied in other ways, to include different features or combinations of features similar to the ones described in this document, in conjunction with other technologies. Generally, example embodiments relate to a system that uses a remote telemetry unit having a capacitor based backup power system and a method of reporting data alarms.

FIG. 1 is a view of a system 1000 in accordance with example embodiments. As shown in FIG. 1, the system 1000 may include one or more RTUs 70, a first computer system 80, a second computer system 81, and one or more receivers 90. The RTUs 70 may be associated with equipment, such as pumps, and may provide messages to the computer systems 80 and 81 regarding whether the associated equipment is receiving adequate electrical power. As will be explained below, the RTUs 70 of example embodiments may receive electrical power and utilize this electrical power to energize various components thereof. The RTUs 70 may also include a power back up system comprised of one or more capacitors which may store energy usable by the RTUs 70 in the event power to the RTUs 70 is interrupted.

In example embodiments, the RTUs 70 may be associated with equipment, for example, pumps 200. Power loss to the equipment may be devastating to the system 1000 if the associated equipment is necessary for proper functioning of the system 1000. For example, in one nonlimiting example embodiment, the system 1000 may be a water treatment system and the associated equipment may be one or more pumps 200 in the water treatment system. If power to the one or more pumps 200 is interrupted, the system 1000 may suffer a catastrophic failure. In the system of example embodiments, the RTUs 70 may send status information regarding power to the associated equipment and the computer system 80 may use this status information to manage the system 1000.

In example embodiments, the RTUs 70 may notify the computer system 80 that normal power is GOOD. GOOD, in this application, indicates power received at the RTUs 70 is what is expected. The computer systems 80 and 81, for example, may be systems associated with a monitoring system for pumping equipment and stations. In example embodiments, the computer system 80 may have persistent data storage (for example, an sql database) and may retain the prior state of the RTUs 70 as well as historical information regarding the state of the RTUs 70. The computer system 80 may be configured to annunciate certain conditions based on a current notification and the preceding notification and may annunciate the conditions to the one or more receivers 90. The receivers 90 may be electronic devices, for example, cell phones, tablets, laptop computers, desktop computers, or any other computing device or computer or other electronic device that sends and/or receives information utilized by technicians who need to be alerted that maintenance may need to be conducted on a piece of equipment associated with the RTUs 70.

For example, when the computer system 80 receives notification from an RTU 70 that the incoming power is GOOD it may compare this notification to a prior state. If the prior state of the RTU 70 was GOOD and this status had already been annunciated, then no action for a power fail alarm is required. If the prior state was FAILED (a condition indicating the RTU 70 was not receiving adequate power), the computer system 80 may initiate a "return-to-normal" delay timer. In example embodiments, once the "return-to-normal" delay timer expires, the normal condition may be annunciated to the appropriate receiver 90. The annunciation may be in the form of a voice message, text message, or email message received by the receivers 90.

On the other hand, for example, when the computer system 80 receives notification from an RTU 70 that the incoming power was FAILED (a condition indicating the RTU 70 was not receiving adequate power and therefore the pump 200 was not receiving adequate power), then a variety of responses may occur.

Immediate Notification: As a first example, upon receiving a FAILED notification from the RTU 70 the computer system 80 may immediately annunciated a FAILED condition to the appropriate receivers 90. This arrangement provides the benefit of immediately notifying the technician that a FAILED condition has occurred. This immediate notification minimizes the technician's response time to the FAILED condition. One drawback to this arrangement of immediate notification is if the power is restored to RTU 70 and pump 200 within a reasonable amount of time. If the technician receives an alarm for a FAILED condition, and the FAILED condition naturally corrects itself, such as the failure being quick interruption in power, then the technician has potentially reacted in an unnecessary manner and spent unnecessary resources and energy.

Figure 2:
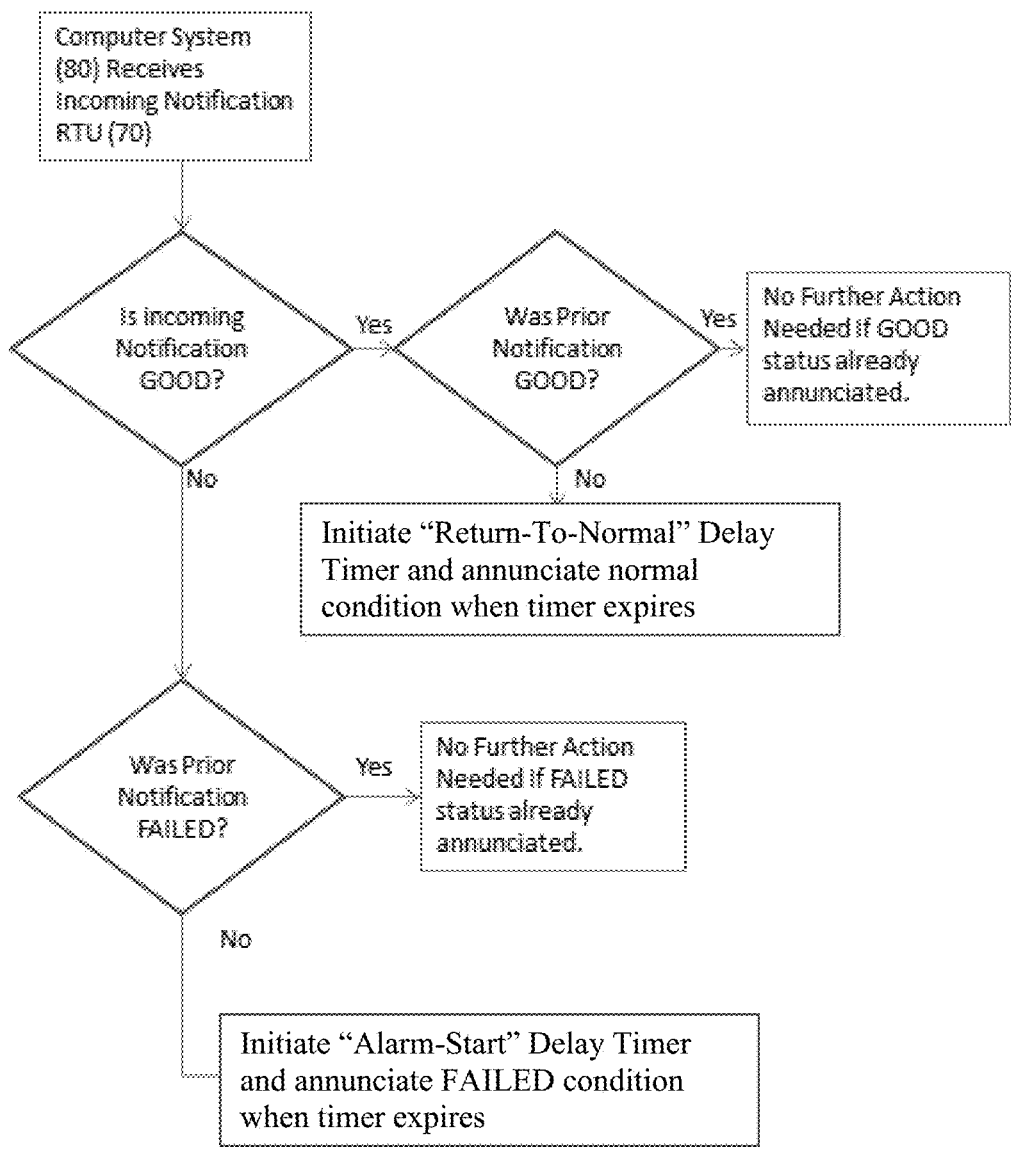
FIG. 2 is a flowchart illustrating steps of a method of reporting data alarms in accordance with example embodiments.

Delayed Notification: As another example, the system 80 may receive a notification from an RTU 70 that the normal power is FAILED. If so, the computer system 80 may compare the present FAILED state to a prior state. If the prior state was FAILED and this status had already been annunciated then no action for the power fail alarm is required. However, if the prior state was GOOD, the computer system 80 may initiate an "Alarm-Start" delay timer. Once the "Alarm-Start" delay timer expires and a GOOD state signal (indicating power has been restored to RTU 70 and pump 200) is not received prior to the expiration of the "Alarm-Start" delay timer, the FAILED condition is annunciated to the appropriate receiver 90. This algorithm may be executed by a processor of the computer system 80. An example of this algorithm is illustrated in FIG. 2. This delayed notification minimizes the amount of alarms the technician for short power interruptions. This reduces the number of alarms that the technician must address. This reduces the amount of wasted time, money, energy and resources spent addressing failures that are self-correcting. This allows the technician to focus their efforts on the actual and meaningful failures. One drawback to this arrangement of delayed notification is that when a true failure does occur, the notification to the technician is delayed and therefore the technician's response time is delayed.

Figure 3:
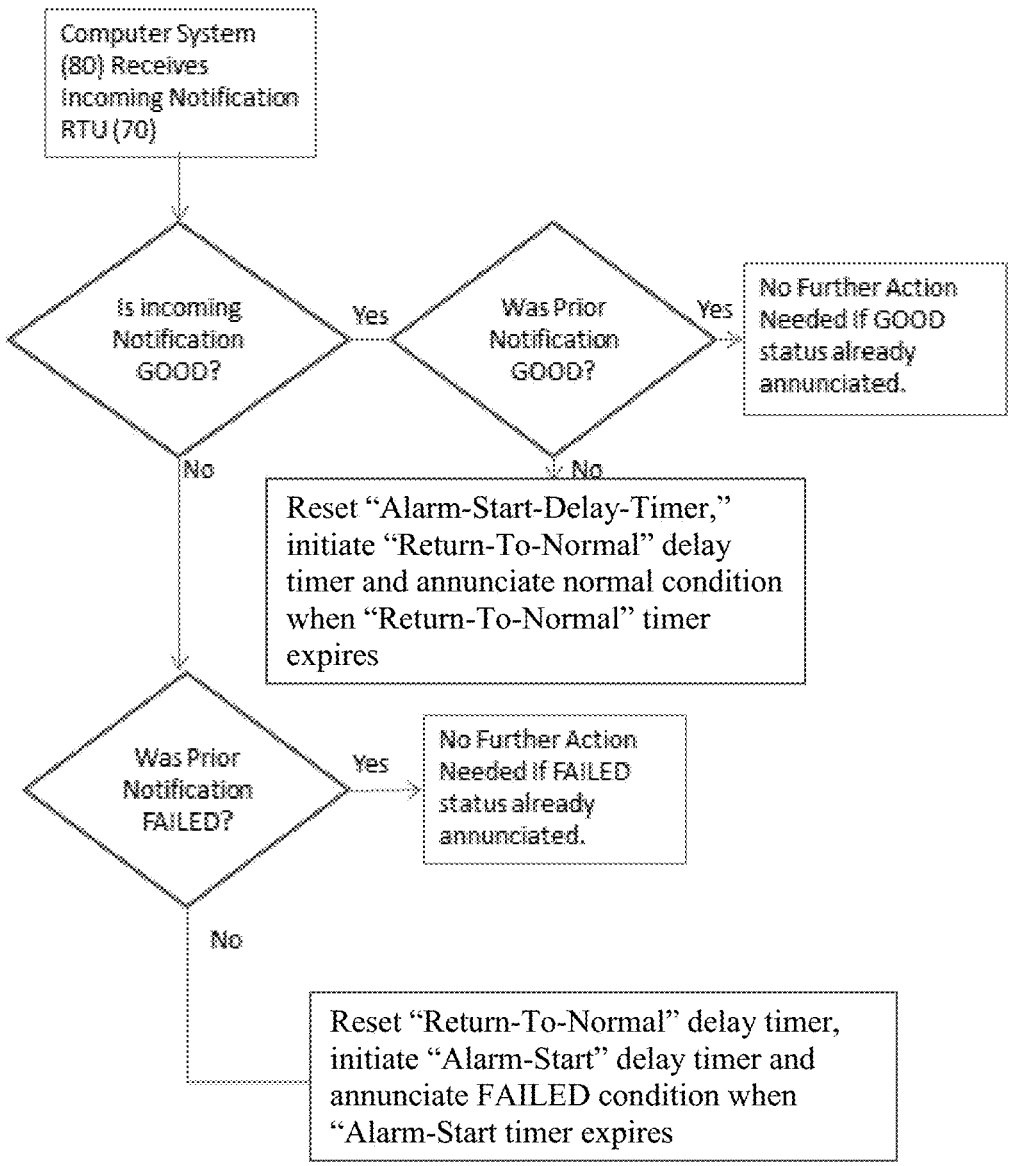
FIG. 3 is another flowchart illustrating steps of a method of reporting data alarms in accordance with example embodiments.

In example embodiments, the algorithm illustrated in FIG. 2 may be modified to include additional operations. For example, if the computer system 80 receives a notification from an RTU 70 that the power status has changed, and the associated time delay has not yet expired, the timer may be reset. For example, if an RTU 70 has notified the computer system 80 that the power has FAILED and had previously notified the computer system 80 that the power was GOOD, but the "return-to-normal" time delay had not yet expired, the "return-to-normal" timer may be reset. This modified method is illustrated in FIG. 3.

In example embodiments, the computer system 80 may be unavailable for various reasons, for example, rebooting. In some situations an RTU 70 may send a signal to computer system 80 when computer system 80 is unavailable. In example embodiments, the power back up system of RTU 70 may not last long enough to send another signal once the computer system 80 becomes available. For this reason, the system 1000 of example embodiments may include the second computer 81 for redundancy. In example embodiments, the second computer 81 may receive messages from the RTUs 70. Thus, when computer system 80 comes back online, it may query the second computer system 81 for any missed power fail message and may then execute the algorithms described in FIGS. 2 and 3.

In example embodiments software loaded onto the computer system 80 may allow for configurable delays for annunciation of an alarm condition as well as a return-to-normal event as well as any other event. These delays, in some situations, are desired to avoid nuisance alarms for short outages. A return-to-normal delay is inherent given the RTU 70 won't transmit the power GOOD condition until sufficient energy has been restored to RTU 70 and/or until sufficient energy stored in the power backup system, such as capacitors 60. The RTU 70 can enforce a minimum value for the return-to-normal delay that is at least as long as the maximum charging time to provide consistent delay time even when the power returns and the power backup system has not yet fully discharged.

Figure 4:
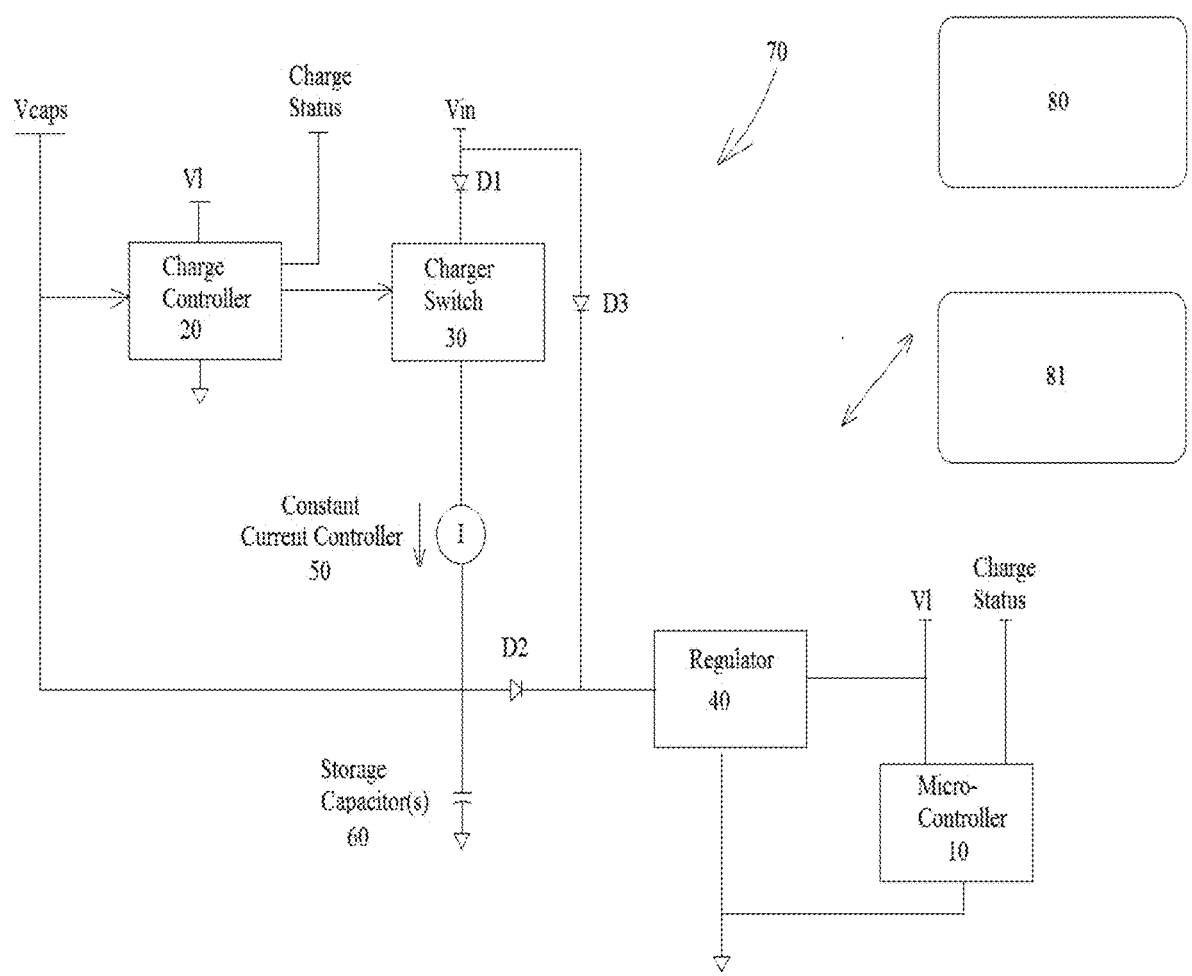
FIG. 4 is a demonstrative schematic plan view of a remote telemetry unit used in association with a power backup system that includes at least one capacitor, in accordance with example embodiments.

FIG. 4 is a simplified block diagram of a portion of an RTU 70 in accordance with example embodiments. More specifically, FIG. 4 illustrates a schematic of a backup power system in the RTU 70. In example embodiments, the RTU 70 may further include additional elements, for example, a radio and input/output (I/O) board, as well as an antenna. These components may allow the RTU 70 to communicate wirelessly with other RTUs 70 which may make it especially well adapted to work in a mesh type network.

As shown in FIG. 4, the example RTU 70 may be comprised of a microcontroller 10, a charge controller 20, a charger switch 30, a regulator 40, a constant current controller 50 (or near constant current controller), and one or more storage capacitors 60 along with other elements such as, but not limited to, diodes D1, D2, and D3 as well as other electronic components and configurations. In this nonlimiting example embodiment, the one or more storage capacitors 60 may function as the aforementioned power backup system. In example embodiments, when power (Vin) is first applied to the RTU 70, the microcontroller 10 may begin executing firmware code which may detect the storage capacitance (Vcaps) voltage. In the event Vcaps is below a minimum accepted level, the charge controller 20 (which may be implemented in the RTU firmware or in separate circuitry) may close the charger switch 30 to charge the one or more capacitors 60 via the constant current controller 50. In example embodiments, the constant current controller 50 may limit the rate at which the one or more capacitors 60 charge so that the power supply Vin need not be excessive in current capacity for a given maximum charging time requirement. It is noted that a simple resistor could be used to limit the charge rate, but that would increase the time (compared to constant current charging) required to charge to an acceptable voltage. In example embodiments it is desired to bring the capacitance up to an acceptable voltage as quickly as possible for a given power supply's current capacity as the RTU 70 may not indicate that normal power is GOOD until it has an adequate energy stored in the one or more storage capacitors 60 to be able to transmit a subsequent power failure. Time required to transmit the message can be quite small, but it is desired to provide enough run time for multiple attempts and situations where a modem needs time to re-connect before transmitting. In example embodiments, once the Vcaps voltage has reached an acceptable level, for example, 19 Volts or the like, the RTU 70 may notify a computer system 80 that normal power is GOOD.

Figure 5:
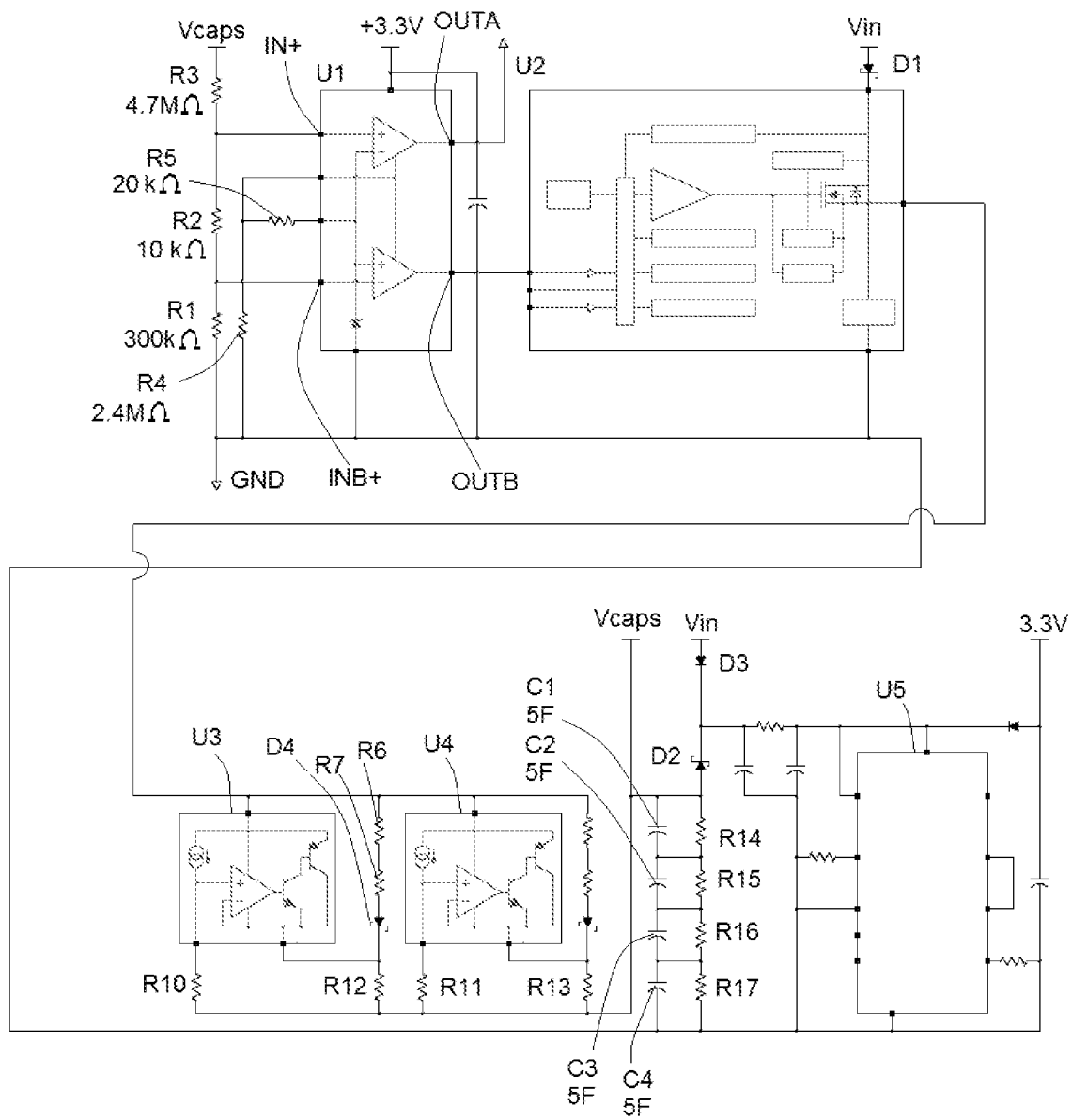
FIG. 5 is another demonstrative schematic plan view of a remote telemetry unit used in association with unit used in association with a power backup system that includes at least one capacitor, in accordance with example embodiments.
Figure 6:
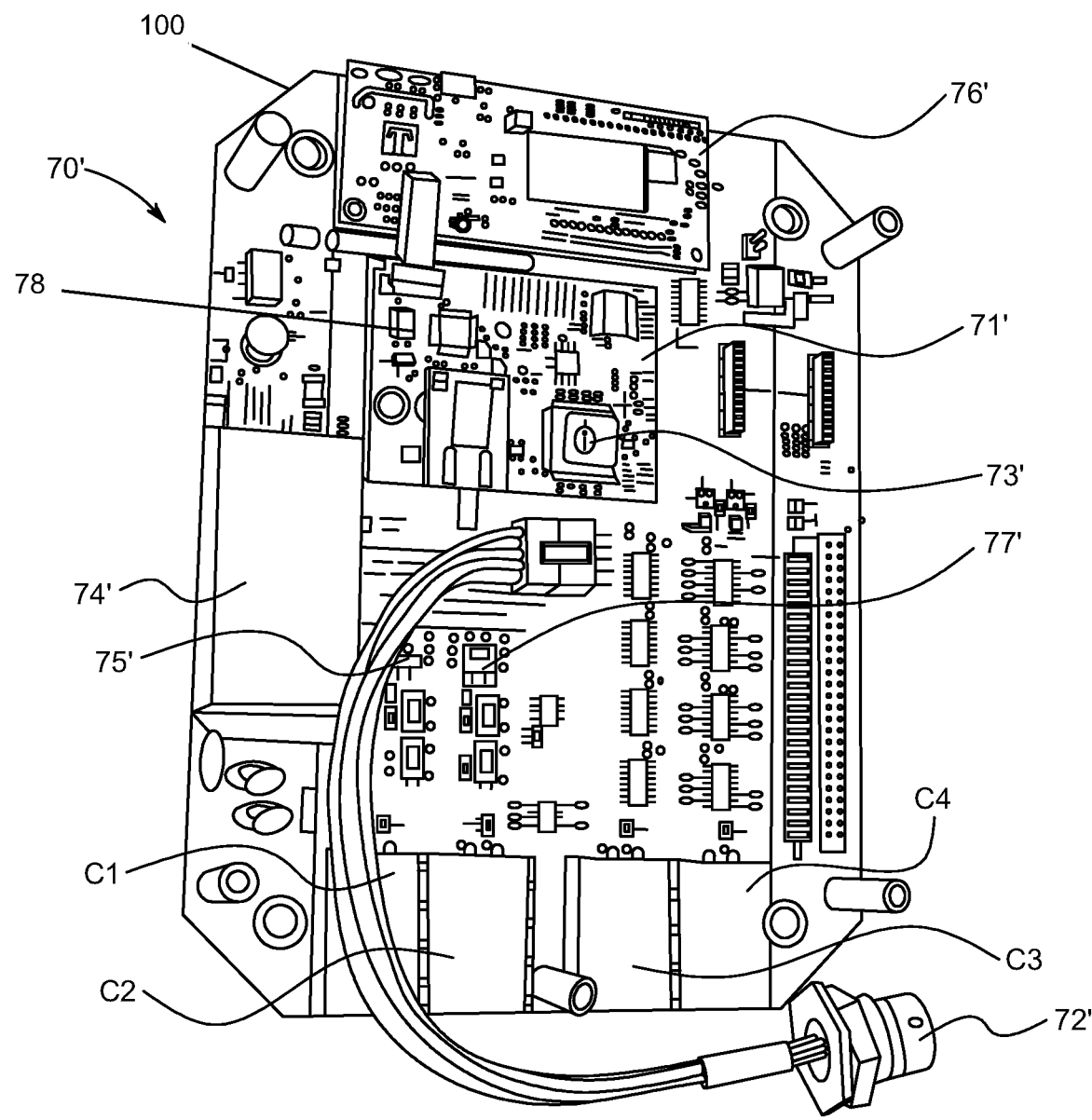
FIG. 6 is a perspective view of an example of a printed circuit board (PCB) of a remote telemetry unit, the view showing the electrical components of the remote telemetry unit positioned on the PCB.

The embodiment of FIG. 4 is a simplified version of the RTU 70. FIG. 5 is a partial schematic view of another example RTU 70'. In particular, FIG. 5 illustrates a backup power system in accordance with example embodiments. FIG. 6 illustrates the RTU 70' embodied on a printed circuit board (PCB) 100 that is configured to be stored within a housing 102. Referring to FIG. 6, the RTU 70' may include additional elements such as an antenna 72', an AC to DC power converter 74', a radio cellular modem 76', and an IO board. The RTU 70' may also include a main board 71' supporting a microprocessor 73' along with a pair of switches 75' and 77' to turn power on and off to the capacitors C1, C2, C3, and C4.

One skilled in the art will readily appreciate the various features illustrated in FIGS. 5 and 6, however, for the sake of completeness, the more critical features will be described. As shown in FIG. 5, the RTU 70' may include a power supply Vin which may be derived from a 24 VDC power supply that may convert a/c power from an electric utility to 24 VDC, however any other form of a power supply is hereby contemplated for use. The RTU 70' may also include an integrated circuit U1 which may, in one nonlimiting example embodiment, be a 2-channel comparator with integral hysteresis, however any other configuration is hereby contemplated for use.

In FIG. 5 the RTU 70' includes a plurality of capacitors C1, C2, C3, and C4 which may be four electric double layer capacitors. These capacitors C1, C2, C3, and C4 may provide a storage capacitance. In example embodiments, the capacitors C1, C2, C3, and C4 may be 5-farad capacitors provided in series to have a total capacitance of 1.25 farads, however any other configuration is hereby contemplated for use. It is understood that this aspect of example embodiments is for purposes of illustration only as the plurality of capacitors may have more than four capacitors to obtain a higher capacitance or less than four capacitors to have a lower capacitance. In addition, while 5 farad capacitors may be useful in the embodiment of FIG. 5, the capacitance of the capacitors C1, C2, C3, and C4 may be something other than 5 farads.

In FIG. 5, the RTU 70' includes a voltage divider which may be comprised of a plurality of resisters. The plurality of resisters may present the capacitor voltage Vcaps to the comparator U1 input INA+ and INB− such that the INA+ voltage matches the comparator reference voltage. For example, in the nonlimiting example embodiment of FIG. 5, the plurality of resisters is comprised of three resisters, R1, R2, and R3 and the three resisters R1, R2, and R3 may present the capacitor voltage Vcaps to the comparator U1 input INA+ and INB− such that the INA+ voltage matches the comparator reference voltage (which, in this nonlimiting example embodiment may be 1.182 volts) when Vcaps equals a voltage of about 19.10 volts. It is understood that the 19.10 volts and 1.182 reference voltage are provided for purposes of illustration only and are not intended to limit the disclosure since the RTU 70' may be designed with different parameters for Vcaps and a different comparator reference voltage, however any other configuration is hereby contemplated for use.

In example embodiments a second plurality of resisters may be provided to set the input hysteresis. For example, in FIG. 5, the second plurality of resisters are represented by resisters R4 and R5 and the input hysteresis may be set to 20 millivolts by R4 and R5. This may result in OUTA going HIGH when INA+ rises to 1.192 volts (1.182+0.010 volts) which may occur when Vcaps exceeds a nominally 19 volts. In example embodiments, current from the plurality of capacitors may flow through diode D2 to regulator U5 when normal power fails. Regulator U5 may provide regulated voltage, for example, regulated 3.3 VDC voltage, to operate the RTU 70' of FIG. 5.

In one nonlimiting example embodiment, the regulator U5 uses a minimum of 5.5 volts at its input to operate with a 3.3 Volt output. Accounting for the forward drop in diode D2, a useable nominal range of 6 to 19 volts remains on the storage capacitance to power the RTU 70' of FIG. 5 after a power failure.

One skilled in the art would readily recognize that energy stored in a capacitor is $(½)*(CV^2)$, where C is the capacitance of the capacitor and V is the voltage across the capacitor. In the nonlimiting example of FIG. 5, this translates to 225.625 joules at 19 volts and 22.5 Joules at 6 volts. The differences of 203.125 Joules can power a 1-watt load for 3 minutes and 23 seconds. If the load is 2 watts only 1 minute and 41 seconds of runtime is available. A 5-watt load would only have about 40 seconds of runtime. To be clear, the stated capacitances and voltages are merely for purpose of illustration only as one skilled in the art could change the capacitance and voltages to obtain the proper run time for a desired load, and any other configuration is hereby contemplated for use.

In example embodiments, the load is the input of the regulator U5, which in turn, may provide power to other devices. The efficiency of the regulator U5 may worsen as it's input voltage is reduced, which may lower runtime even further. As such, the controller may be configured to power down all unnecessary loads when a failure of the normal power is detected.

In the nonlimiting example embodiment of FIG. 5, the INB-voltage matches the comparator's reference voltage when Vcaps reaches a preset voltage. In the nonlimiting example of FIG. 5, the comparator's reference voltage is 1.182 volts and the Vcaps preset voltage is 19.75 volts. These voltage values are provided for purposes of illustration only as the comparator's reference voltage may be greater or less than 1.182 volts and the Vcaps preset voltage may be greater or less than 19.75 volts. In the case where the comparator's reference voltage is 1.182 volts and Vcaps equals 19.75 volts, the OUTB goes HIGH when INB-falls below 1.172 volts (1.182-0.010) which occurs when Vcaps=19.57 volts. OUTB goes LOW when INB– rises above 1.192 volts (1.182+0.010) which occurs when Vcaps=19.9 volts.

In the nonlimiting example embodiment of FIG. 5, OUTB controls the charger switch U2, causing charging through the current limiters until Vcaps reaches 19.9 volts. Charge bleeds off through balancing resistors R14, R15, R16, and R17, but when Vcaps falls to 19.57 volts, charging resumes. The level of charge is maintained well above the 19 volt CHARGED status level.

In the nonlimiting example of FIG. 5, the current controller shown in the simplified block diagram is provided in the embodiment by U3, U4, D4, D5, R6, R7, R8, R9, R10, R11, R12, and R13. The disclosed arrangement provides a constant current of 400 milliamperes when charging which allows a 1-amp 24 VDC supply to provide the charging current at Vin as well as 600 milliamperes available to power the RTU and its accessories. With the arrangement shown, CHARGED status may be obtained in one minute. If a simple resister were used to limit current to 400 milliamperes the charging time would be nearly 2 minutes.

The RTUs 70 and 70' of FIGS. 4 and 5 present some advantages over conventional RTUs (noting that RTU 70' may be used in lieu of RTU 70). For example, conventional RTUs use batteries as a back-up power source. However, batteries have certain problems such as off-gassing which prevents them from being used in a closed or sealed system. Not being able to place conventional RTUs in a sealed housing or sealed system or at least within sealing compound (like a potting compound) is very disadvantageous as RTUs are often used in the open environment where they are exposed to moisture and water. As such, not having the RTU sealed exposes the RTU to premature failure.

In example embodiments, however, the back-up power systems are capacitor based and therefore do not suffer the problem of off gassing. As such, the RTUs 70 and 70' of example embodiments are ideal for closed and/or sealed and/or potted systems which may be desirable in several applications. That is, because RTUs 70 and 70' have capacitors C1, C2, C3 and C4 which do not suffer the problem of off gassing, as compared to batteries which suffer from the problem of off gassing and therefore they cannot be sealed or potted, not to mention they need periodic replacement, therefore RTUs 70 and 70' can be used within a sealed container and/or they can be potted.

That is, some or all of the electronics of the RTUs 70 and 70' of FIGS. 4 and 5, for example, may be covered by a silica potting compound, including capacitors C1, C2, C3 and C4 which may protect the electronics from the environment. It is possible to cover capacitors C1, C2, C3, and C4 in a silica potting compound as they do not off gas, they have a long useful life and do not need periodic replacement and instead have a life similar to that of the other components on the PCB 100. It is not practicable to cover batteries in a silica potting compound as batteries tend to need replacement sooner than other components of the PCB 100 and they off gas. Covering some or all of the components of PCB 100 in a silica potting compound has a tendency to increase the functional life of PCB 100 as the silica potting compound seals the electrical components of the PCB and protects them from moisture and corrosion, which is particularly useful in outdoor applications.

RTU 70, 70' includes at least one sensor 78. Sensor 78 is any form of a sensor that senses the flow and/or supply of power to RTU 70, 70'. In one arrangement sensor 78 is a current sensor, which is a device which detects electric current in a wire. In one arrangement, sensor 78 is a comparator chip or a comparator system associated with RTU 70, 70' that monitors voltage received by RTU 70, 70' and when the voltage drops below a predetermined threshold the sensor 78 determines a power failure has occurred. In one arrangement, sensor 78 is a comparator chip or a comparator system associated with RTU 70, 70' may be attached to and/or part of and/or incorporated within the structure and/or functionality of microcontroller 10, microprocessor 73' of RTU 70, 70'. In this arrangement, when sensor 78 senses that there has been a loss of power, capacitors C1, C2, C3 and C4 provide power to RTU 70 and 70' and a signal is transmitted to computer system 80 informing computer system 80 of the power failure condition of RTU 70, 70'. This transmission is made with the power supplied by capacitors C1, C2, C3 and C4. While four capacitors C1, C2, C3, C4 are shown in use, any number of capacitors are hereby contemplated for use.

Figure 7A:
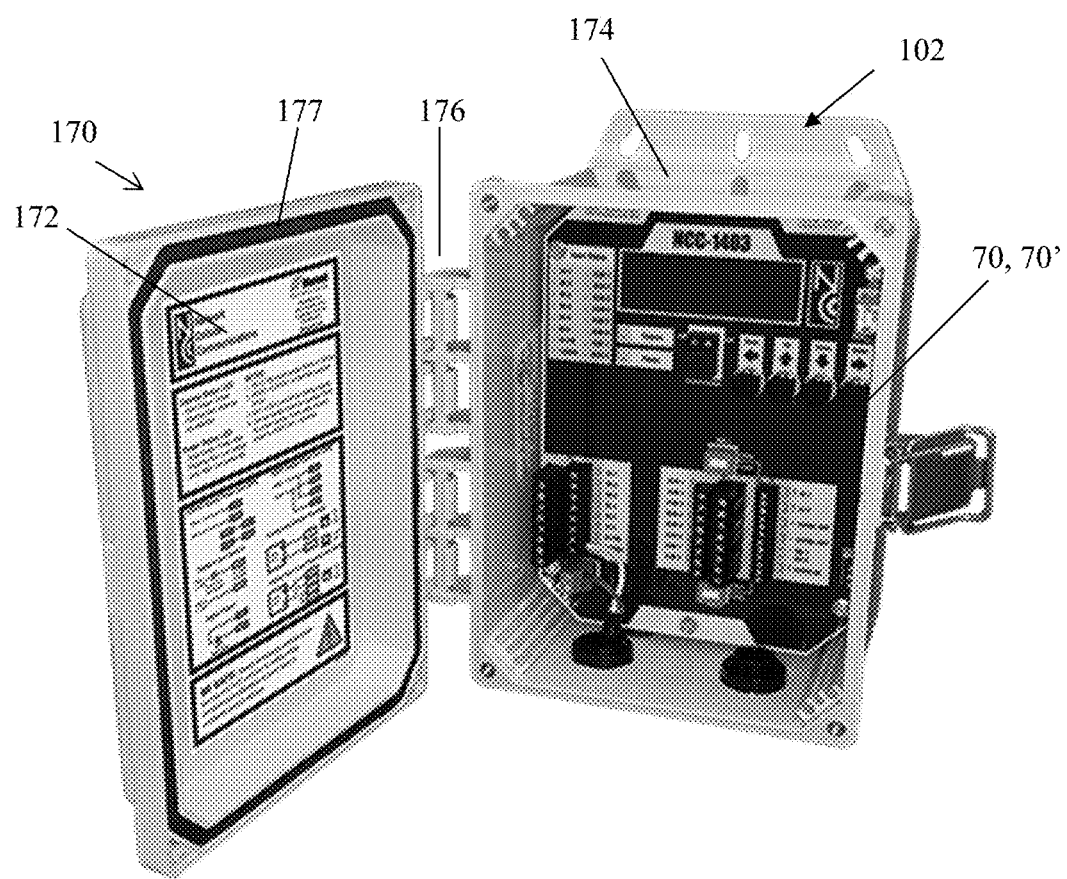
FIG. 7A is a perspective view of a remote telemetry unit housed in a structure configured to provide a sealed environment in accordance with example embodiments, the view showing the structure being a housing, the view showing the door of the housing open thereby exposing the printed circuit board held within the housing that connects the electrical components of the remote telemetry unit.

FIG. 7A is a view of an RTU 70, 70' arranged in a housing 102, which in the arrangement shown is a box like structure 170. The box like structure 170 includes a door 172 which may be connected to a box body 174 by hinges 176. In one nonlimiting example embodiment, the box like structure 170 may be a NEMA box, for example, NEMA box #3. In this particular nonlimiting example embodiment the door 172, that includes a seal 177, may be closed upon the box body 174 creating a sealed environment for the RTU 70, 70' therein. The sealed environment, for example, may prevent water and/or air and/or humidity and/or dirt from entering the box body 174 thus protecting the RTU 70, 70'. This arrangement would not be possible if a battery was used for backup power since batteries may corrupt the sealed environment due to the aforementioned gassing. In example embodiments, the box like structure 170 housing the RTU 70, 70' may be placed on or near the a piece of equipment to which it is associated. For example, if the piece of equipment is a pump 200, for example, a grinder pump or a low pressure pump, the box like structure 170 may be mounted next to and/or formed as part of a pump panel which controls the pump 200. RTUs 70, 70' may be incorporated by any manner, method or means with pump 200.

Figure 7B:
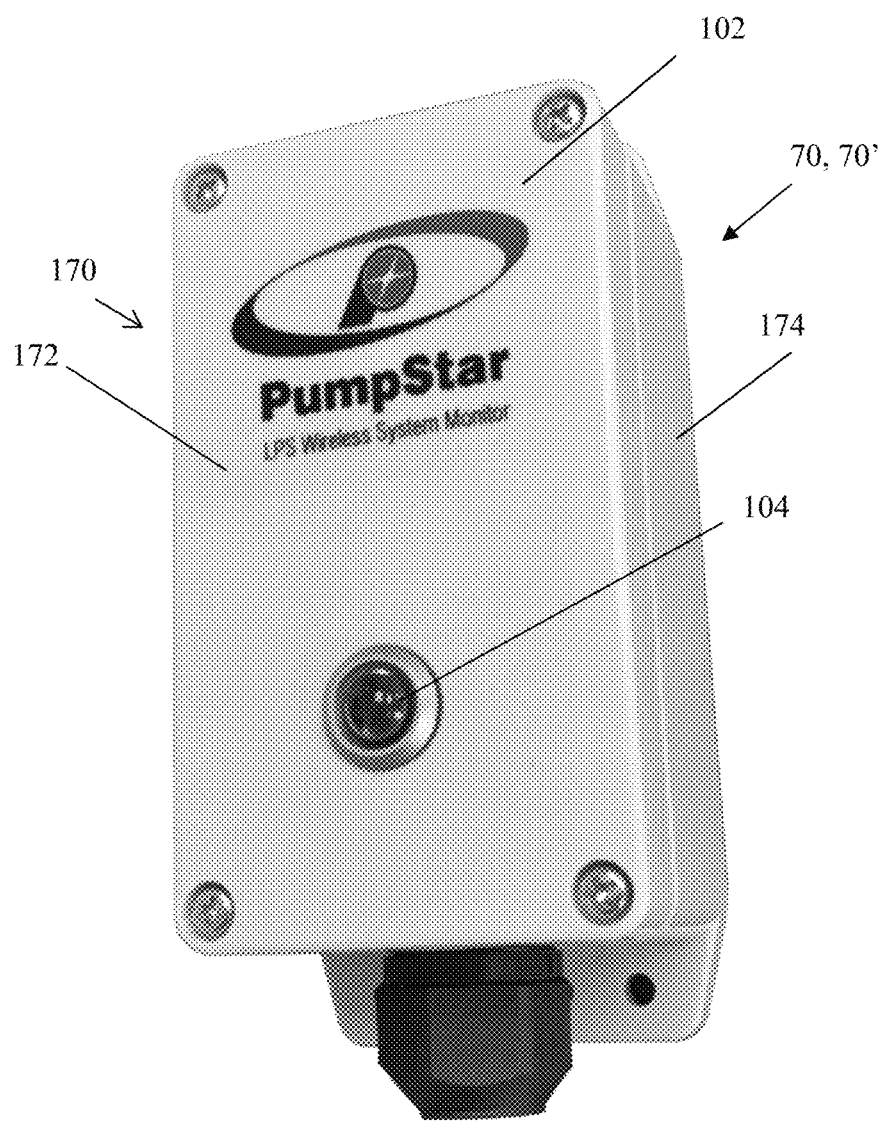
FIG. 7B is a perspective view of a remote telemetry unit housed in a structure configured to provide a sealed environment in accordance with example embodiments, the view showing the structure being a housing, the view showing the door of the housing in a closed state thereby sealing the hollow interior of the housing, the view showing a beacon light positioned in the exterior of the housing, the beacon light configured to illuminate and/or flash when an error or fault occurs, such as a power fail or a fault.

FIG. 7B shows an alternative arrangement of an RTU 70, 70' that includes a box like structure 170 or housing that includes a beacon light 104 in the door 172 of the box like structure 170 that illuminates to display various information such as failure alarm normal operation, power outage, a low water level, a high water level or any other information.

Figure 8:
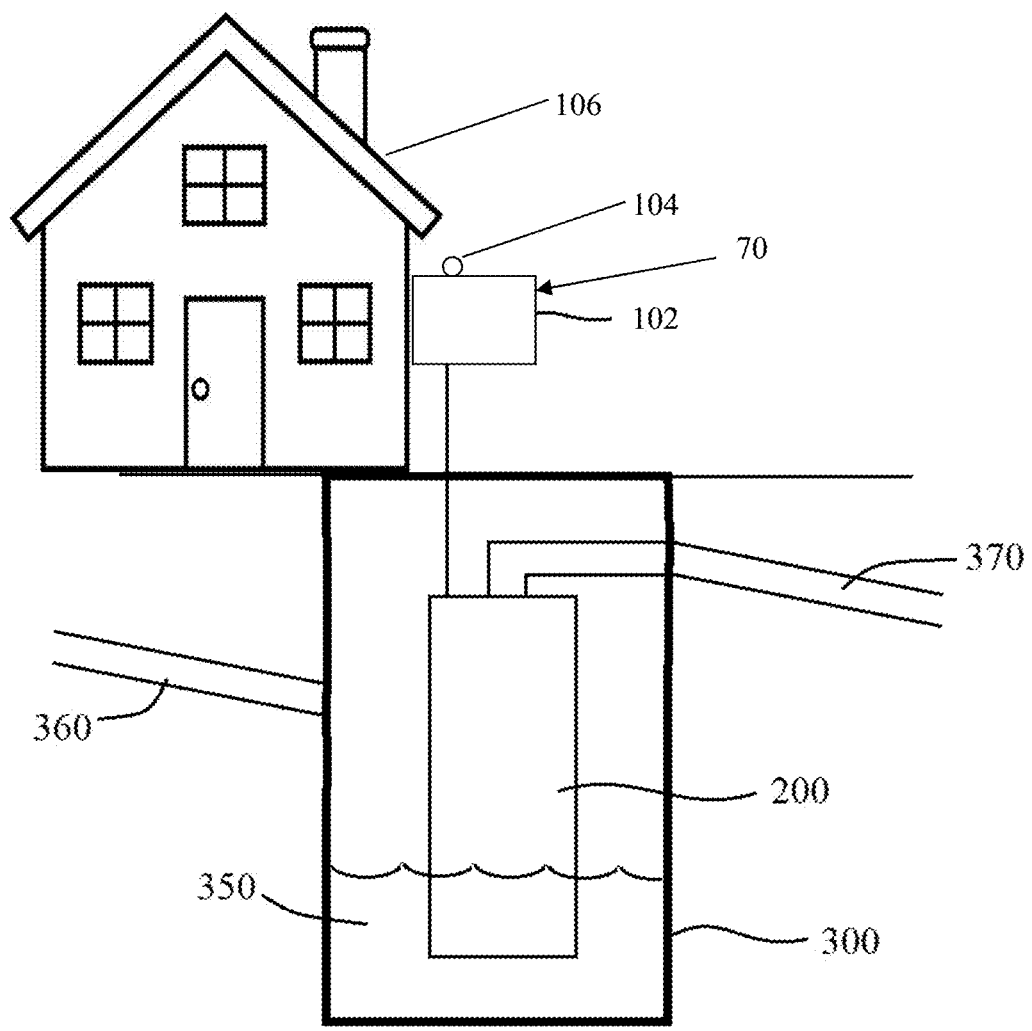

In example embodiments, the RTUs 70, 70' may be used in several systems. For example, the RTUs 70, 70' may be used with low pressure sewer (LPS) to send a signal in the event a pump 200 in the LPS fails. FIG. 8, for example, illustrates a portion of an LPS system. More specifically, FIG. 8 illustrates a receiving tank or pit 300 having an input 360 and an output 370. The tank 300 may enclose a pump 200 which, in one nonlimiting example embodiment, may a grinder pump, configured to grind waste materials in waste water 350 and move wastewater 350 from tank 300 to the output 370.

In one nonlimiting example embodiment, the pump 200 may be arranged near a residential home and may be configured to receive the wastewater from the home via the input 360, as well as potentially from other houses 106 as well. The pump 200 may also receive power from the home's circuit breaker, the grid or any other power source connected to the house 102. In LPS systems, the pump 200 may jam due to solids that may be received in the tank 300 by the input 360. This may cause the circuit breaker to trip thus cutting off power to the pump 200. In example embodiments, the RTU 70 (or 70') may be electrically connected to the circuit breaker (either directly or indirectly) so that it receives power from the circuit breaker as well. The RTU 70 (or 70') may, in fact, be connected to the circuit breaker so that if power to the pump 200 is cut off, power to the RTU 70 (or 70') would also be cutoff In another example, the power may be cut to RTU 70, 70' due to a power failure. Cutting off power to the RTU 70 causes the RTU 70 (or 70') to send a signal indicating power to the pump has been cut off. The signal may be received by a system that manages the LPS system and/or the home owner to alert the system manager or home owner that power to the pump 200 has been cut off.

Figure 9:
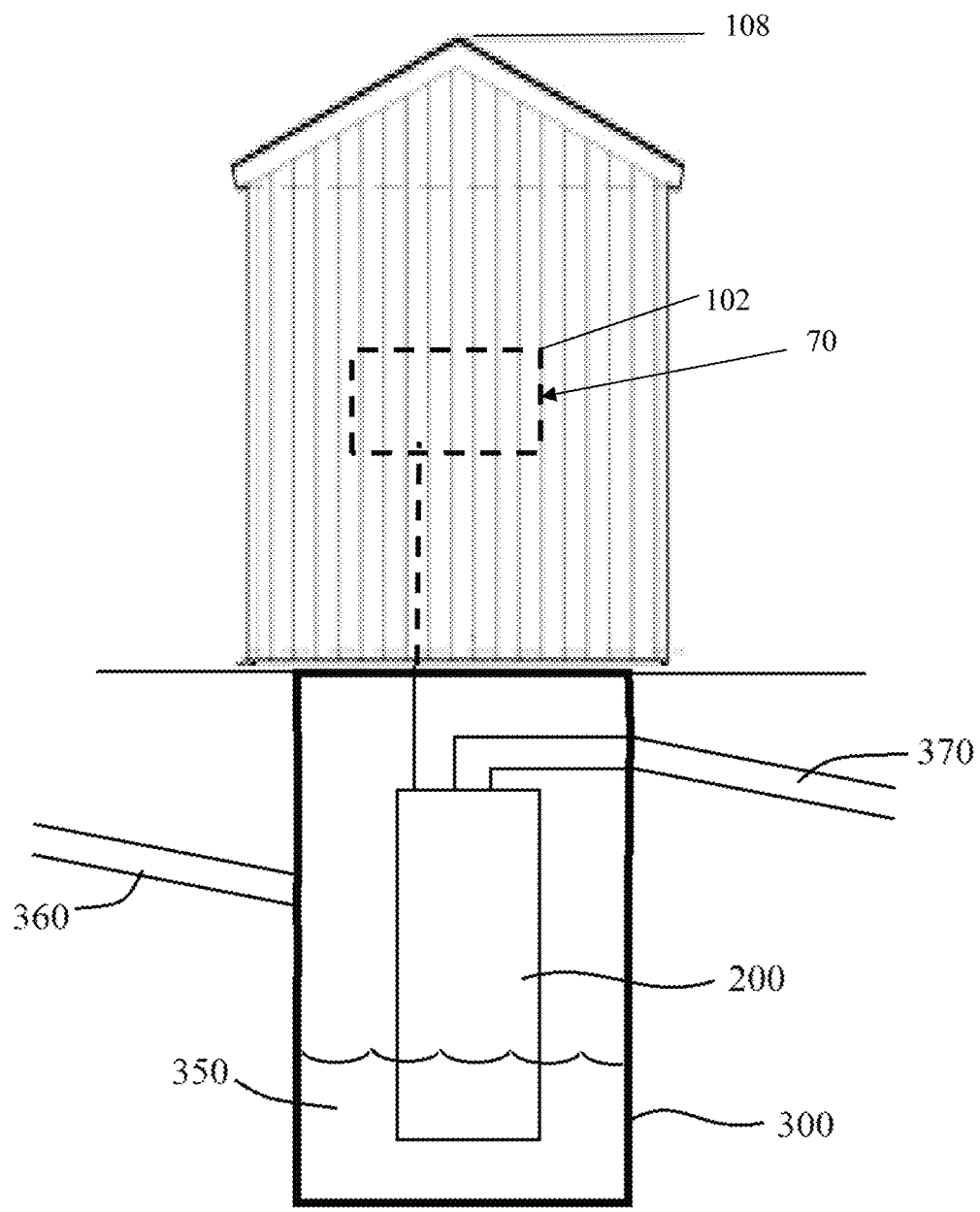
FIG. 9 is a plan view of a remote telemetry unit connected to a pump housed within a pit, the view showing an inflow and outflow of fluid to the pit, the view showing the housing of the remote telemetry unit attached to a pump house in a commercial application for use primarily with cellular communication.

With reference to FIG. 9, an RTU 70 is shown used in association with a pump house 108 with a pump 200 positioned within a pit 300.

Figure 10:
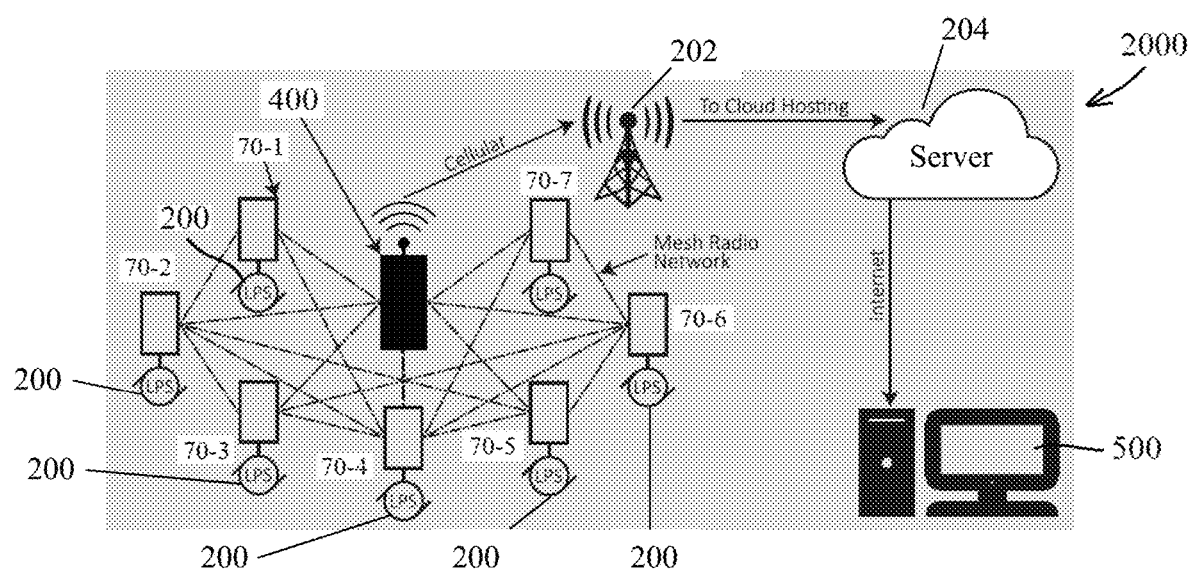
FIG. 10 is a plan view of a system of monitoring a plurality of remote telemetry units with associated pumps, the system having a central processor or computer master unit connected to a cellular tower and a cloud based server and a computer interface, the view showing the components of the system in a mesh network wherein each component is connected to all other components.
Figure 11:
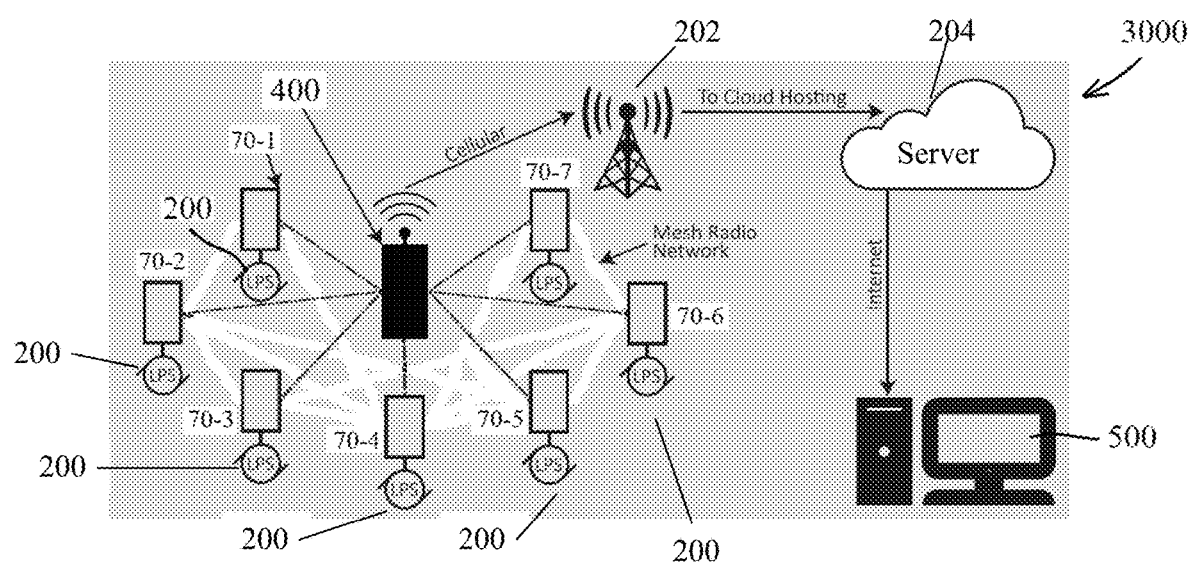
FIG. 11 is another plan view of a system of monitoring a plurality of remote telemetry units with associated pumps, the system having a central processor or computer master unit connected to a cellular tower and a cloud based server and a computer interface, the view showing the components of the system in a star network or a hub and spoke network wherein each component connected to the centrally located computer master unit.

The RTUs 70, 70' may also be used with relatively large systems as shown in FIGS. 10 and 11. FIG. 10, for example, illustrates an example system 2000 comprised of a plurality of RTUs 70-1, 70-2, 70-3, 70-4, 70-5, 70-6, and 70-7 coupled to, or integrated with, a plurality of low pressure sewer pumps 200. In the nonlimiting example embodiment of FIG. 10, the RTUs 70-1, 70-2, 70-3, 70-4, 70-5, 70-6, and 70-7 may be substantially configured as RTUs 70 and/or 70' and may be configured to send data to a computer master unit 400 as well as each other through a mesh-type network. In FIG. 10, the system 2000 further comprises a cell tower 202 configured to transmit data to the cloud 204 to which a computer interface 500 may interact. The computer interface 500 may, for example, be displayed on a conventional desk top computer, a laptop, a cell phone, an i-Pad, or any other conventional computer interface or combination thereof. This computer interface 500 may be considered a receiver 90 as is shown in FIG. 1, and is then monitored by and used by a technician that monitors and maintains system 2000. Although the embodiment of FIG. 10 illustrates the system 2000 as having seven RTUs 70-1, 70-2, 70-3, 70-4, 70-5, 70-6, and 70-7 and seven pumps 200, the system 2000 may actually include hundreds of RTUs 70 and pumps 200. As such, the number of RTUs 70 and pumps 200 illustrated in FIG. 10 is for the purpose of illustration only and is not intended to limit the inventive concepts described herein.

In this arrangement, the RTUs 70-1, 70-2, 70-3, 70-4, 70-5, 70-6, and 70-7 communicate with one another as well as with computer master unit 400 using a communication module utilizing a short-range communication protocol such as Wi-Fi, Bluetooth, radio communication, or the like or any other suitable wireless communication method and/or protocol. Using a short-range communication protocol may be less expensive and may require less power. Using a short-range communication protocol is suitable in systems wherein the pumps 200 are closely clustered, such as in a residential development. In contrast, computer master unit 400 communicates with cellular tower 202 using a longer-range communication protocol such as cellular communication. Alternatively, computer master unit 400 communicates over the internet to cloud 204 through a wireless and/or wired connection to the internet.

In the nonlimiting example embodiment of FIG. 9, the RTUs 70-1, 70-2, 70-3, 70-4, 70-5, 70-6, and 70-7 may be configured to relay information regarding their associated pumps 200. For example, the RTUs 70-1, 70-2, 70-3, 70-4, 70-5, 70-6, and 70-7 may be configured to wirelessly send information regarding their associated pump's operation. In addition, the system 2000 may include flowmeters associated with the pumps and the RTUs 70, 70' may obtain information regarding the flow of liquid through the pumps 200 and transmit this information wirelessly as well as any other operational information. Thus, the RTUs 70-1, 70-2, 70-3, 70-4, 70-5, 70-6, and 70-7 may transmit information related to the times their associated pumps 200 operate as well as the flow of fluid flowing through their respective pumps 200 and/or any other additional information may be transmitted. Any other additional accessories may be added to the system 200 and information from these accessories may be transmitted through RTUs 70, 70' to computer master unit 400, cellular tower 202, the cloud 204 and eventually to receiver 90 and displayed on computer interface 500.

In example embodiments, a server in the cloud 204 may receive and/or store information about system 2000. This server in the cloud 204 may also include a database wherein all transmitted information is saved in logs for later review, manipulation and evaluation. For example, in system 2000 the pumps 200 may each be associated with a building, for example, a house 106, and the server may include an electronic database configured to store addresses of the houses 106, the type of pump 200 at the house 106, as well as owner information, and any other information that is desired. The server may also store data indicative of the pump 200 and/or RTU 70 associated therewith. For example, each pump 200 and/or RTU 70, 70' may have a unique identifier assigned to the pump 200 and/or RTU 70 and this identifier may be transmitted in an electronic message sent by the RTU 70. In this way, the server may understand which pumps 200 are associated with a received electronic message. In yet another embodiment, the server may dynamically assign unique identifiers to either (or both) of the RTUs 70 and pumps 200. This latter embodiment may employ a protocol similar to DHCP which is commonly used to allocate IP addresses to nodes in a system.

In example embodiments, the unique identifiers may be encoded in a memory chip (such as microcontroller 10, microprocessor 73' or the like) which may be present in the RTUs 70. Thus, a processor of the RTU 70 and/or 70' may access the memory chip so that the unique identifier may be included in a message sent by the RTU 70 to the server in the cloud 204. This encoding may occur when the RTU 70 is manufactured or may be encoded into the RTU 70 by an operator or via the aforementioned dynamic assignment process. In the alternative, the unique identifier may be encoded in a memory chip which may be present in the pump 200. Like the RTUs 70, the unique identifier may be encoded in the memory chip of the pump 200 when the pump 200 is manufactured or may be encoded at a later date by an operator or the aforementioned dynamic allocation process. Regardless, when the RTU 70 is connected to the pump 200, the RTU 70 may read the unique identifier present in the memory chip of the pump 200 and incorporate this unique identifier into any message sent by the RTU 70.

In the nonlimiting example of FIG. 10, the system 2000 is configured as a mesh radio network. In other words, in the system 2000, the RTUs 70-1, 70-2, 70-3, 70-4, 70-5, 70-6, and 70-7 may send data to nearby RTUs 70-1, 70-2, 70-3, 70-4, 70-5, 70-6, and 70-7 and data may flow through the mesh network in any way until it reaches the computer master unit 400 where it is sent to the cloud 204 through cellular tower 202 and/or directly through the internet. The embodiment of FIG. 10, however, is not meant to limit the inventive concepts disclosed herein. For example, rather than being incorporated into a mesh network, the RTUs 70 (or more specifically 70-1, 70-2, 70-3, 70-4, 70-5, 70-6, and 70-7) may communicate directly to the computer master unit 400 in a hub and spoke type architecture as illustrated in FIG. 11.

Referring to FIG. 10, the RTUs 70-1, 70-2, 70-3, 70-4, 70-5, 70-6, and 70-7 may send data to the computer master unit 400 either directly or indirectly through any one or a plurality of the other RTUs. This is known as a mesh network which provides robustness due to the many ways that a signal can travel to get to its final destination. For example, when the pump associated with RTU 70-1 is activated, the RTU 70-1 may send an electronic message to the computer master unit 400 either directly or through any one of the other RTUs 70, 70', for example, RTU 70-2. The computer master unit 400 may forward this message to the server in the cloud 204 where the data is stored and accessible by a user using the computer interface 500. The message, for example, may include information such as when the pump 200 was started, stopped, duration of pumping action, and flow of water through the pump 200 and the like information. The RTUs 70-1, 70-2, 70-3, 70-4, 70-5, 70-6, and 70-7 may update the server in the cloud 204 as their respective pumps 200 are operated and the data may be stored by the server in the cloud 204. In this way, updated information may be stored on the server in the cloud 204 in substantially real time.

In example embodiments, the server in the cloud 204 may perform various management functions, data analysis functions, predictive functions and the like. For example, the server in the cloud 204 may be configured to accept information from the RTUs 70, record the information, and send certain alerts based on the information received from the RTUs 70. For example, the server in the cloud 204 may receive information regarding the run times of each pump 200 as well as how much liquid is pumped by each pump 200. This data may be tabulated and displayed so a user of the system 2000 can understand how the system 2000 is functioning. This information can be used to determine where problems in the system 2000 may be occurring so as to help make corrective actions before a catastrophic event occurs.

Note that while the disclosure mentions a server in the cloud 204, it is hereby contemplated that the server may be any form of a server or servers positioned at any location. As such, this term is meant to be nonlimiting.

Figure 12:
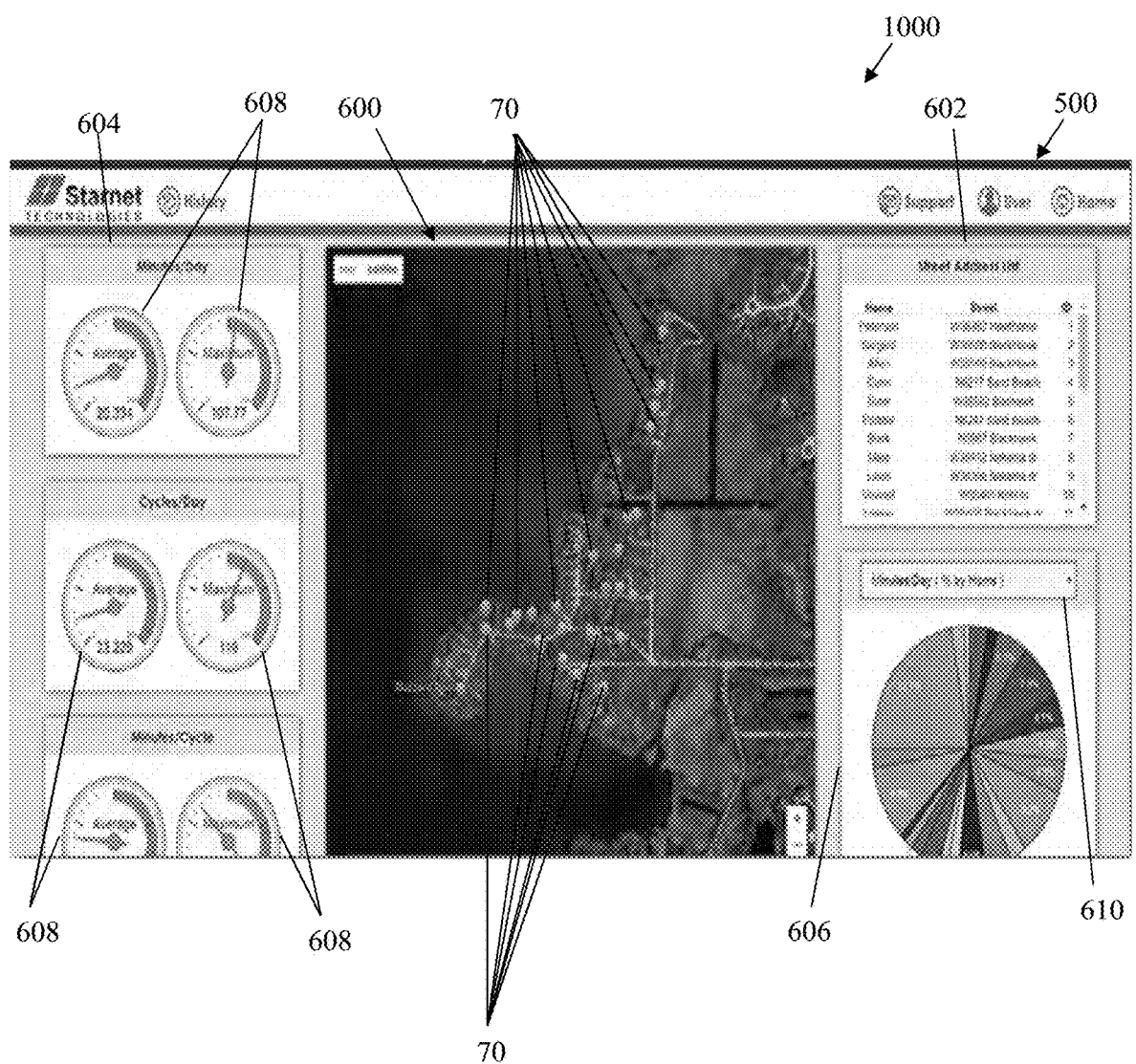
FIG. 12. is a plan view of a computer interface, the view showing an interactive map of a plurality of RTUs with associated pumps, the view showing a list of the addresses of the RTUs and associated pumps, the view showing a graphical display of a plurality of gauges showing particular information, and the view showing a pie chart showing particular information.

FIG. 12 is an example of how data obtained from the RTUs 70 and/or 70' may be presented to a user and/or technician on computer interface 500 of a receiver 90, such as a cell phone, a lap top computer, a desktop computer, or any other display of any other electronic device. In FIG. 12, locations of the RTUs 70 and their respective pumps 200 are overlaid on a map 600 showing the geographic location of each RTU 70 and pump 200 combinations. In the particular nonlimiting example of FIG. 12, icons representing locations of twenty-five RTUs 70 are shown on the map 600. The view shows an aerial or satellite view of the map-area, however a setting can be changed to show a map instead of an aerial or satellite view. This map 600 is interactive and allows a technician to zoom in and zoom out and move the area of map 600 around for analysis and review of the system 1000. This type of computer interface 500 may make it relatively easy for a technician to locate an RTU 70 in the event the RTU 70 sends a message indicating their respective pump 200 is not functioning properly. In order to better illustrate which pump 200 may require maintenance, the pertinent icon associated with an RTU 70, 70' may be presented in a different color than the rest. For example, when an RTU 70, 70' sends an error signal, such as a power failure, the icon associated with that RTU 70, 70' and pump 200 requiring maintenance may be shown as a red icon whereas RTUs 70, 70' and pumps 200 not requiring maintenance may be illustrated as green or grey icons, or icons of any other color. In one arrangement, to further illustrate issues, RTUs 70, 70' and pumps 200 that require maintenance and/or have an error signal associated with them may flash, pulsate, be shown in a larger size, and/or be set off from other RTUs 70, 70' by any other manner.

In the arrangement shown, as one example, map 600 is positioned in the middle of computer interface 500, however any other arrangement is hereby contemplated for use. A window 602 is presented to the right of map 600 that presents a list of RTUs 70, 70' and pumps 200 including the Name, Street Address, and Number of the RTUs 70, 70' and pumps 200 within the particular system 1000. Any other information may be presented in this list presented in widow 602 such as the owner's name, phone number, make and model and/or serial number of the RTUs 70, 70' and pumps 200, maintenance notes, history, and/or any other information. In one arrangement, the icons associated with RTUs 70, 70' and pumps 200 in the map 600 are interactive, meaning that a technician may hover over the icon in map 600 or name in a list in window 602 and the icon or name will react such as by changing size, color, font type or react in any other way. In one arrangement, when the icon in map 600 or name in a list in window 602 is interacted with additional information regarding the RTUs 70, 70' and pumps 200 is presented on the computer interface 500, such as through a tooltip a popup window or by any other manner, method or means. Also, in one arrangement when either an icon in map 600 or name in a list in window 602 is interacted with both the icon in map 600 or name in the list in window 602 react to the interaction, such as by changing color, font, text treatment (such as being bolded) or by any other manner, method or means.

As one example, various information about the system 1000 in general and each RTU 70/pump 200 combination may also be presented in a second window 604 that presents various operational information in a graphical representation, such as in a gauge 608. In the arrangement shown, as one example, a plurality of gauges 608 are shown in the second window 604 to the left of map 600 that show operational characteristics of the entire system 1000, and when a particular icon of a particular RTU 70, 70' and pump 200 is clicked upon then the gauges 608 display operational characteristics of that particular RTU 70/pump 200. As one example, in the arrangement shown, six gauges 608 are presented with three vertically stacked sets of a pair of gauges 608 positioned next to each other.

In the arrangement shown, as one example, the top pair of gauges 608 display information regarding the minutes per day the pump 200 or pumps 200 are running. The left-positioned gauge 608 shows the average minutes per day and the right positioned gauge 608 shows the maximum minutes per day (which is the most-used pump 200 in the system 1000 when it is the system 1000 that is selected or when an individual pump 200 is selected it is the most minutes per day in a predetermined number of days, such as the last thirty days for example).

In the arrangement shown, as one example, the middle pair of gauges 608 display information regarding the cycles per day the pump 200 or pumps 200 are running. The left-positioned gauge 608 shows the average cycles per day and the right positioned gauge 608 shows the maximum cycles per day (which is the most-used pump 200 in the system 1000 when it is the system 1000 that is selected or when an individual pump 200 is selected it is the most minutes per day in a predetermined number of days, such as the last thirty days for example).

In the arrangement shown, as one example, the middle pair of gauges 608 display information regarding the cycles per day the pump 200 or pumps 200 are running. The left-positioned gauge 608 shows the average cycles per day and the right positioned gauge 608 shows the maximum cycles per day (which is the most-used pump 200 in the system 1000 when it is the system 1000 that is selected or when an individual pump 200 is selected it is the most minutes per day in a predetermined number of days, such as the last thirty days for example).

In the arrangement shown, as one example, these gauges 608 include a dial that goes from a zero to a maximum with two shaded areas indicating a high level followed by a redline level that indicate the severity of the reading. The gauge 608 includes a needle that points to the value of the gauge 608. The gauges 608 also redundantly display a numerical value at the bottom center of the gauge 608. This display of gauges 608 help a reviewing technician to quickly understand how the system 1000 and/or an individual pump 200 is running within the realm of zero to maximum. The numbers and settings of the gauges 608 may be set by the technician. Any other information may be presented on gauges 608 and any number of additional gauges may be presented in window 604 on computer interface 500.

As one example, various information about the system 1000 in general and/or each RTU 70 and pump 200 combination may also be presented in a third window 606 that presents various operational information in a pie chart. In the example shown, third window 606 includes a drop down menu 610 that includes some or all of the different characteristics that may be measured thought the system 1000 as a system 1000 as a whole and/or on a pump 200 by pump 200 basis. This includes that above-mentioned criteria such as: number of minutes per day that pumps 200 are running, the number of cycles per day that pumps 200 are running, the number of minutes per cycle that pumps 200 are running, or any other characteristic of operation. Once the type of information is selected from the drop down menu, the pie chart is generated showing how much each pump 200 in the system 1000 accounts for in the overall amount. The user then can click on any pump 200 in the pie chart and the location will be highlighted in the interactive map 600 by illumination of the associated icon. The opposite is true as well. That is, the user can click on any pump 200 on the map 600 and the information related to that pump 200 will be highlighted in the pie chart in window 606, the address will be highlighted in window 602 and the gauges of window 604 will automatically present particular information related to that pump 200.

The interactive map 600 may be zoomed in or out, or boundaries may be drawn to make a subset of pumps 200 for analysis purposes. This allows the technician to focus in in the areas of the system 1000 that may have issues or that may be particularly vulnerable. The ability to collect and display this information as well as the ability to manipulate this information along with the improvements related to the use of capacitors (including increased life of the system, less maintenance, improved performance, and greater ability to indicate an error state or power failure and less chance that a failure will occur that is not reported or discovered) provide greatly enhanced improvements in the ability to understand how the system 1000 as a whole and each pump 200 is operating and how to correct issues before catastrophic events occur (such as filling all the basements of an entire neighborhood with raw sewage). The map 600 and the information gathered may be manipulated in any other way to provide the desired insights.

Figure 13:
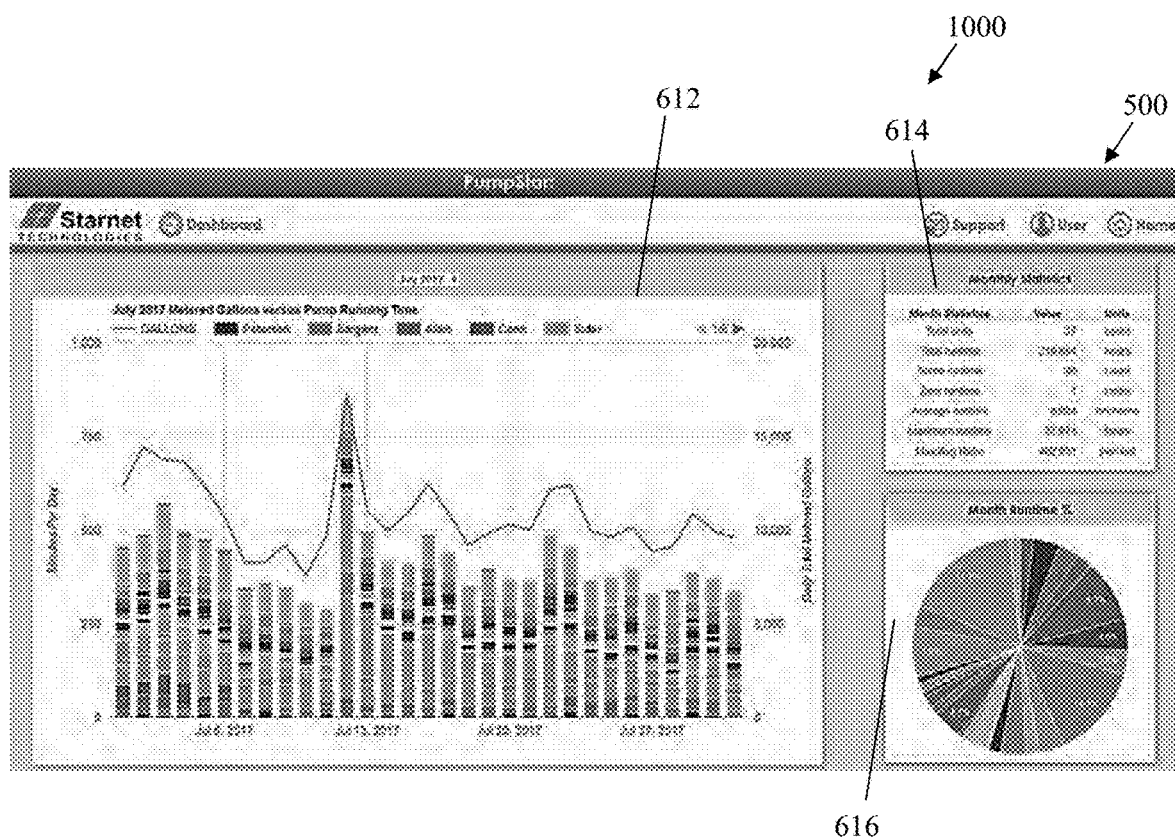
FIG. 13 is a display screen of a computer interface of the system presented that displays a chart of the metered gallons versus pump running time.

FIG. 13 is an example of how data obtained from the RTUs 70 and/or 70' may be presented to a user and/or technician on computer interface 500 of a receiver 90, such as a cell phone, a lap top computer, a desktop computer, or any other display of any other electronic device. In FIG. 13, another display screen of system 1000 is presented that displays a chart 612 of the metered gallons versus pump running time. On the X-axis are the days of the month, on the left-positioned Y-axis is the minutes per day that the pumps run and on the right-positioned Y-axis is the daily total metered gallons. Each bar of the bar chart 612 shows in colors the contribution of each pump within the system 1000 to that bar in the chart 612. Positioned to the right of the chart 612 is a window 614 that shows the monthly statistics of the system 1000 including the total units, total runtime, some runtime, zero runtime, average runtime, median runtime, among other information. Positioned below the window 614 is another window 616 that includes a pie chart that displays the month runtime percentage with each pie slice indicating a different pump 200 in the system 1000 and showing proportionally the amount of runtime that pump 200 contributed to the overall runtime. This display shown in FIG. 13 wholly interactive and can be clicked upon at any point to determine additional information.

Figure 14:
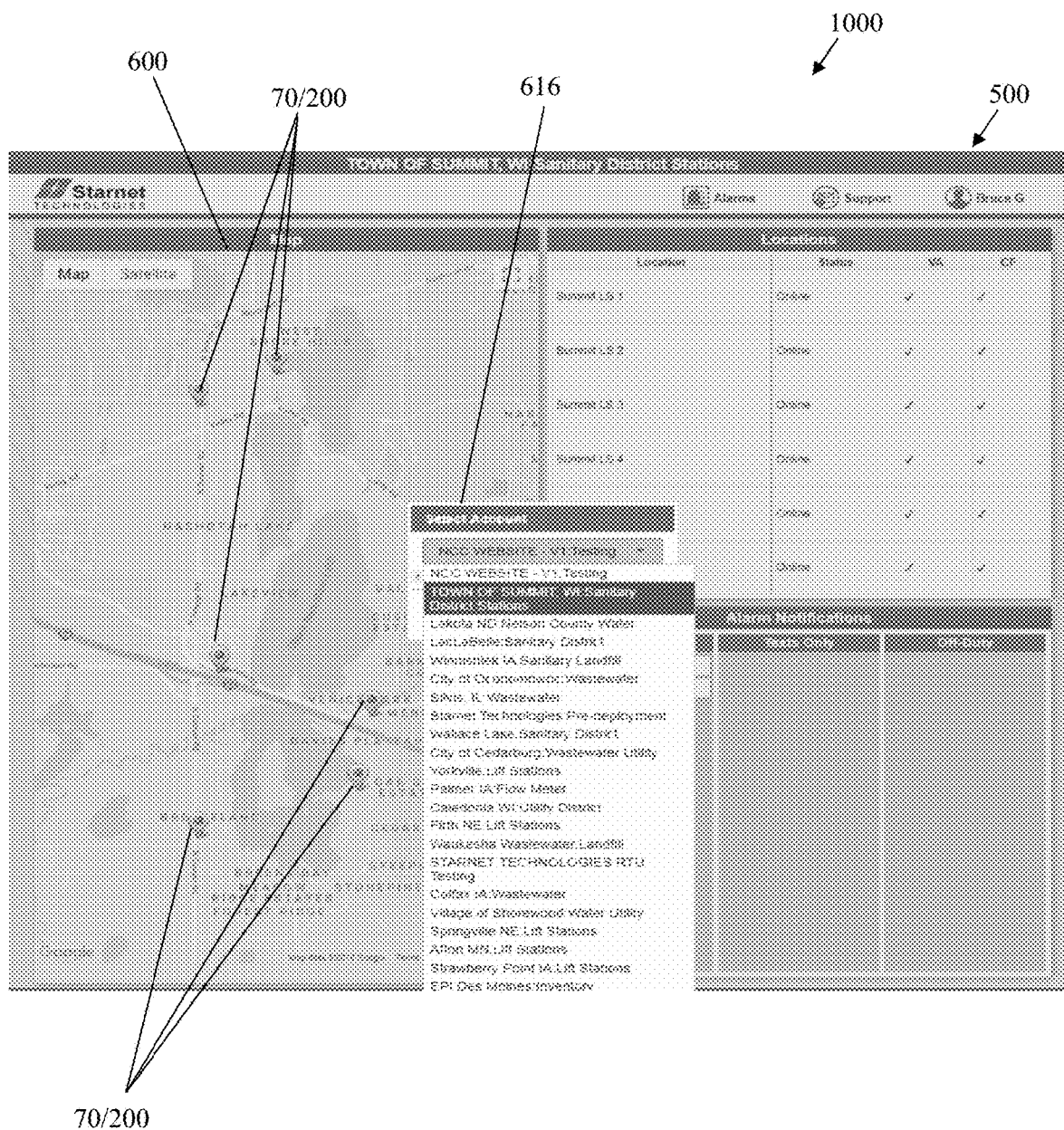
FIG. 14 is a display screen of a computer interface of the system presented that displays an interactive map that displays the locations of RTUs and pumps on the map and includes a drop down window that allows the technician or user to select the network or location of pumps and associated RTUs.

FIG. 14 is another example of how data obtained from the RTUs 70 and/or 70' may be presented to a user and/or technician on computer interface 500 of a receiver 90, such as a cell phone, a lap top computer, a desktop computer, or any other display of any other electronic device. In FIG. 14, another display screen of computer interface 500 of system 1000 is presented that displays an interactive map 600 that displays the locations of RTUs 70 and pumps 200 on the map. The view showing a drop down window 618 that allows the technician or user to select the network or location of pumps 200 and associated RTUs 70. In one arrangement, upon logging into the computer interface 500 using a receiver 90, such as a cell phone, laptop computer, desktop computer, tablet computer or the like, a technician is presented with this screen.

Figure 15:
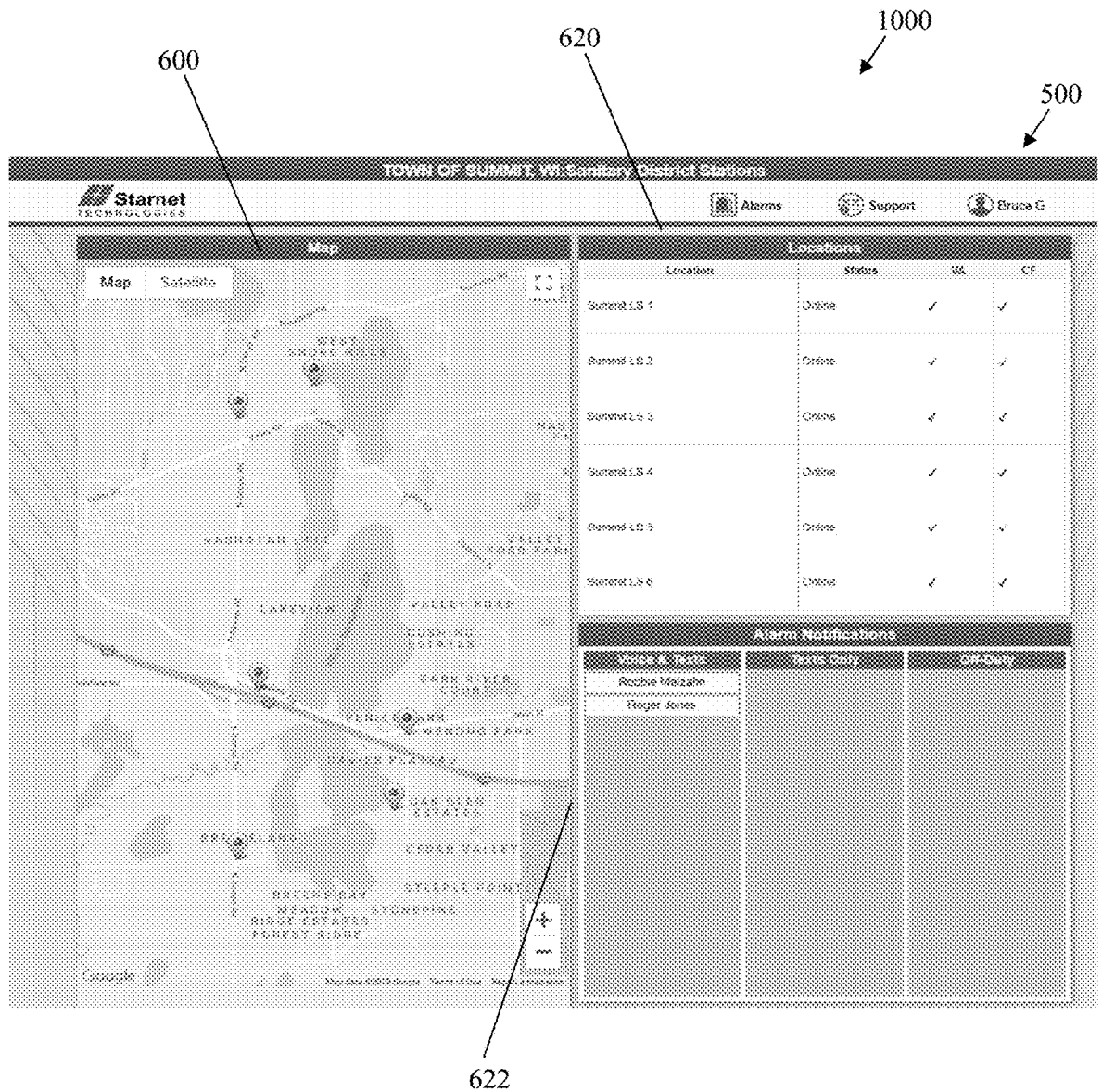
FIG. 15 is a display screen of a computer interface of the system presented that displays an interactive map that displays the locations of RTUs and pumps on the map.

Once a technician logs in and selects the location of pumps 200 and RTUs 70 from drop down window 618 the user is presented with the view shown in FIG. 15. In this view the interactive map 600 is presented in a window at the left of the computer interface 500 that displays the location of each RTU 70 and pump 200. A window 620 is shown at the upper right that displays each of the RTUs 70 and associated pumps 200 along with their status as well as other pertinent information. A window 622 is shown at the lower right that displays who is notified and how they are notified when an alarm notification is received by the system 1000 and includes a box for voice and text, texts only and off duty. This display of computer interface 500 is interactive, like the other displays, and further information can be easily obtained by manipulating the computer interface 500.

Figure 16:
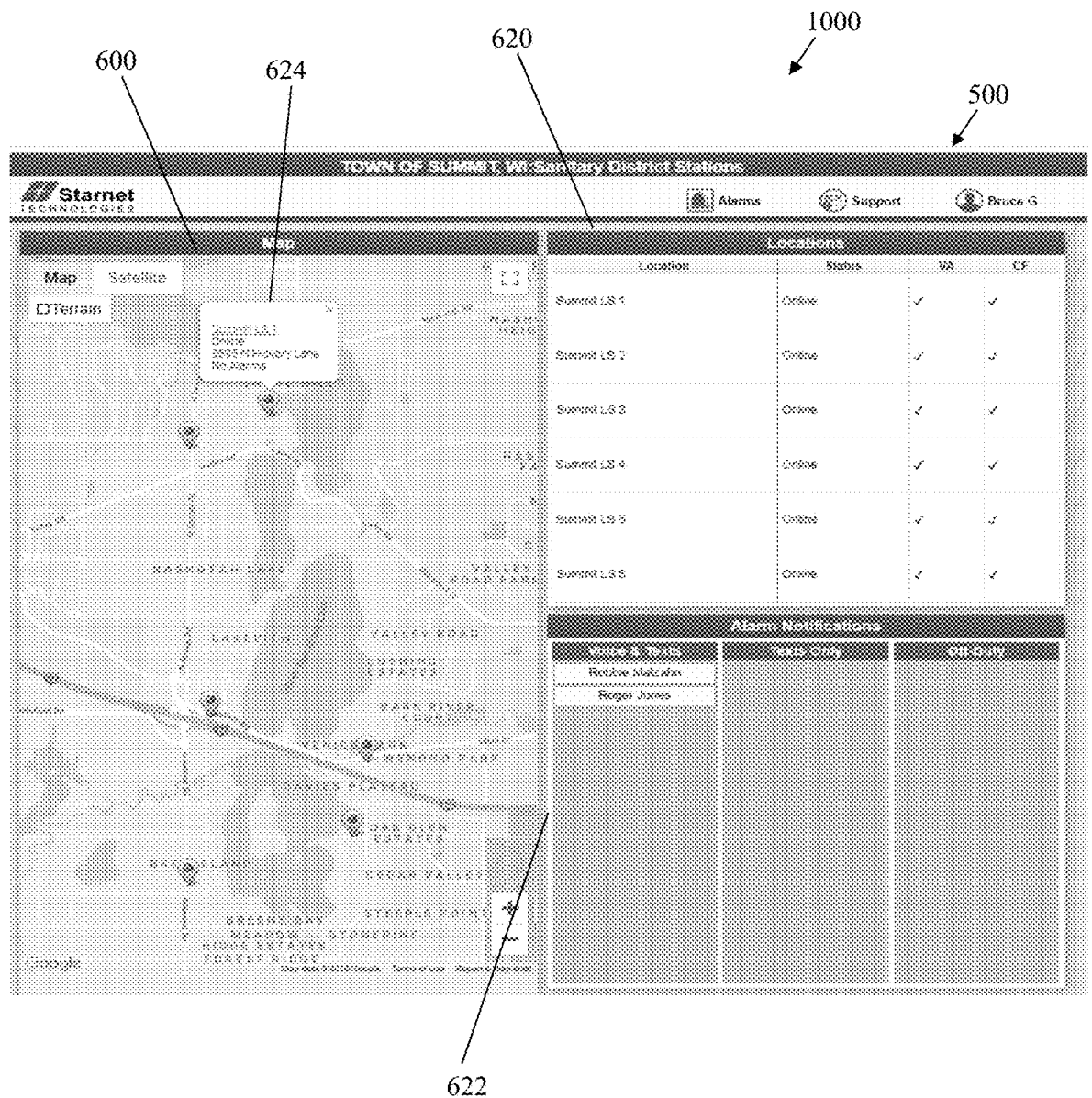
FIG. 16 is the view of FIG. 15, with an RTU and pump selected which shows further information regarding the selected RTU and pump.

As an example of the interactive nature of computer interface 500, FIG. 16 shows what happens when the technician clicks on an icon associated with an RTU 70 and pump 200. In this example, a popup window 624 opens over the map 600 that displays additional information regarding the selected RTU 70 and pump 200 including the name, status, address and alarm condition of the pump 200. Any other information may be displayed.

Figure 17:
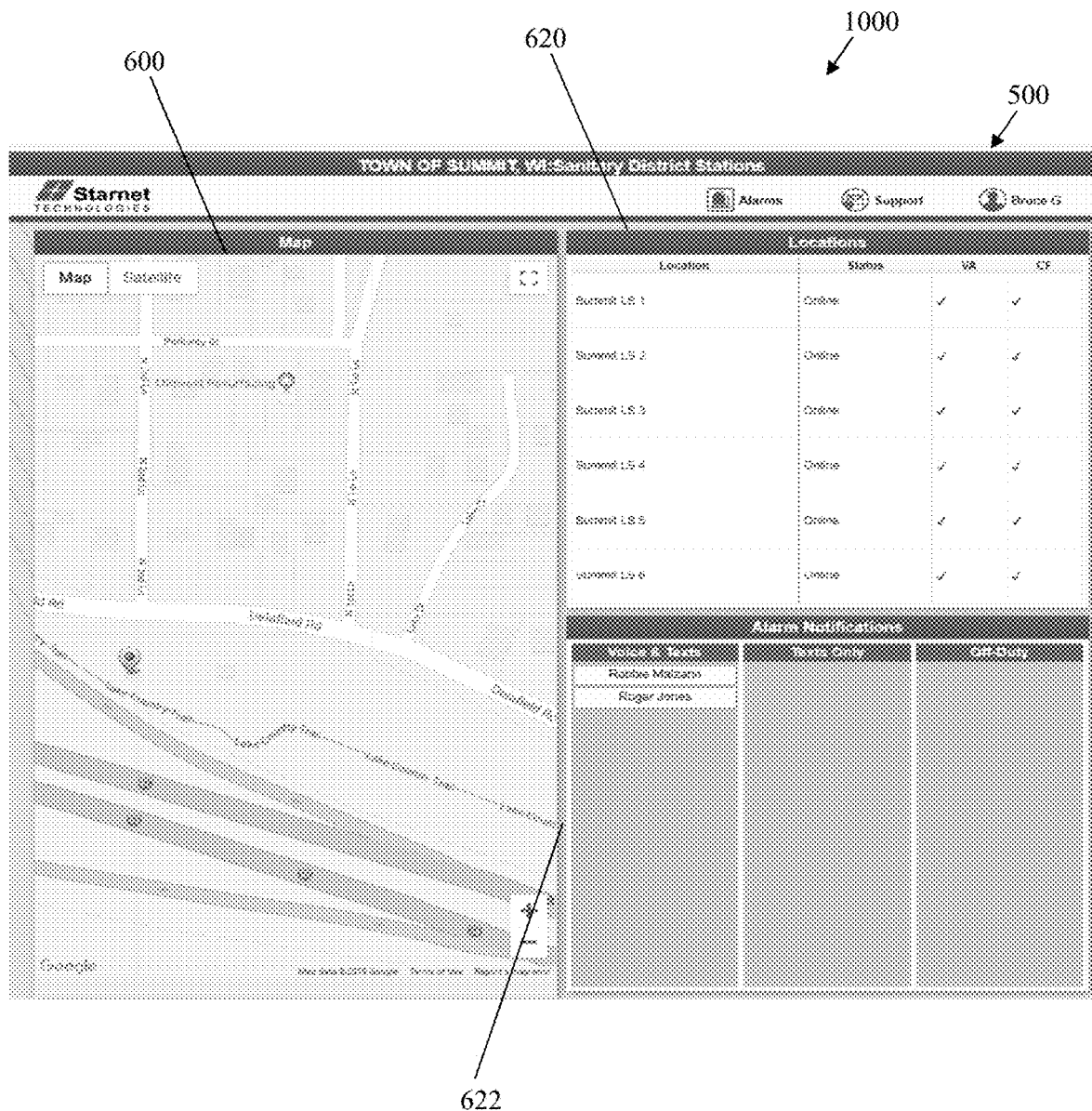

As an example of the interactive nature of computer interface 500, FIG. 17 shows the map zoomed-in thereby displaying greater detail about the location of RTU 70 and pump 200.

Figure 18:
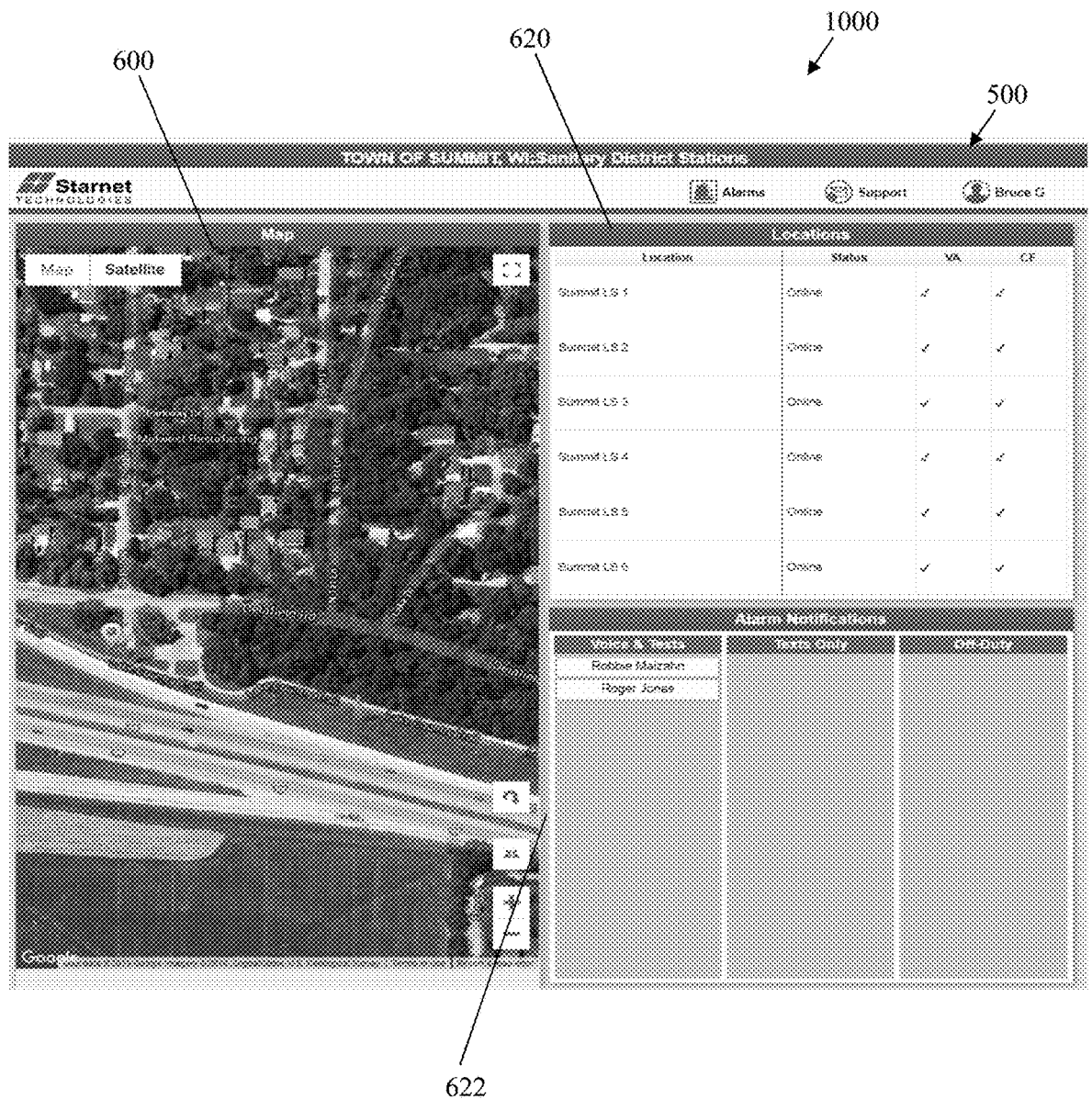
FIG. 18 is the view of FIG. 17, with the map showing a satellite or aerial view.

As an example of the interactive nature of computer interface 500, FIG. 18 shows the map using a satellite or aerial view using the toggle buttons in the upper-left corner of map 600 thereby displaying greater detail about the location of RTU 70 and pump 200.

Figure 19:
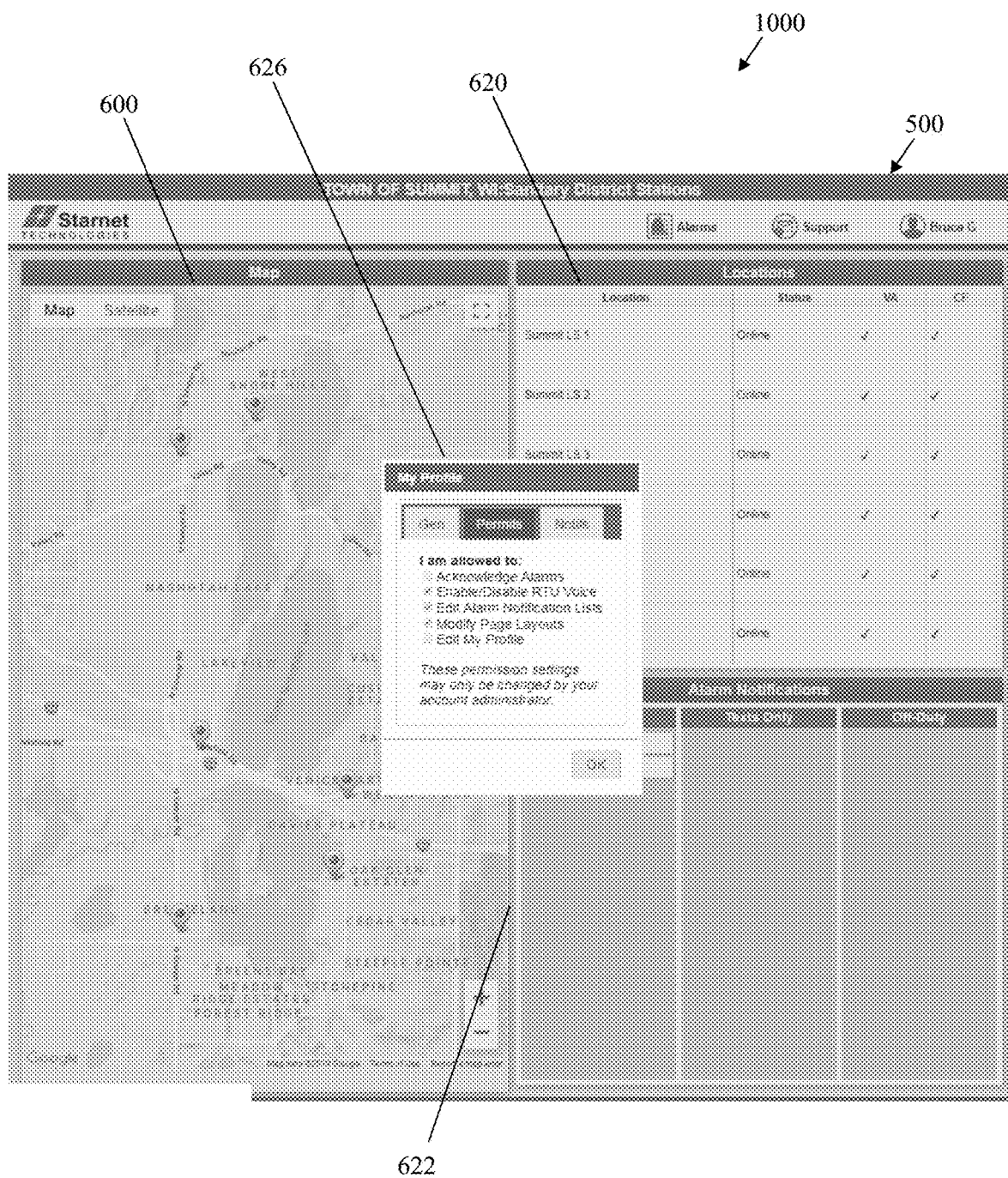
FIG. 19 is a display screen of a computer interface of the system presented that displays a popup window that allows the technician to adjust the permissions they have in the system.

As an example of the interactive nature of computer interface 500, FIG. 19 shows a popup window 626 that allows the technician to adjust the permissions they have in the system 1000.

Figure 20:
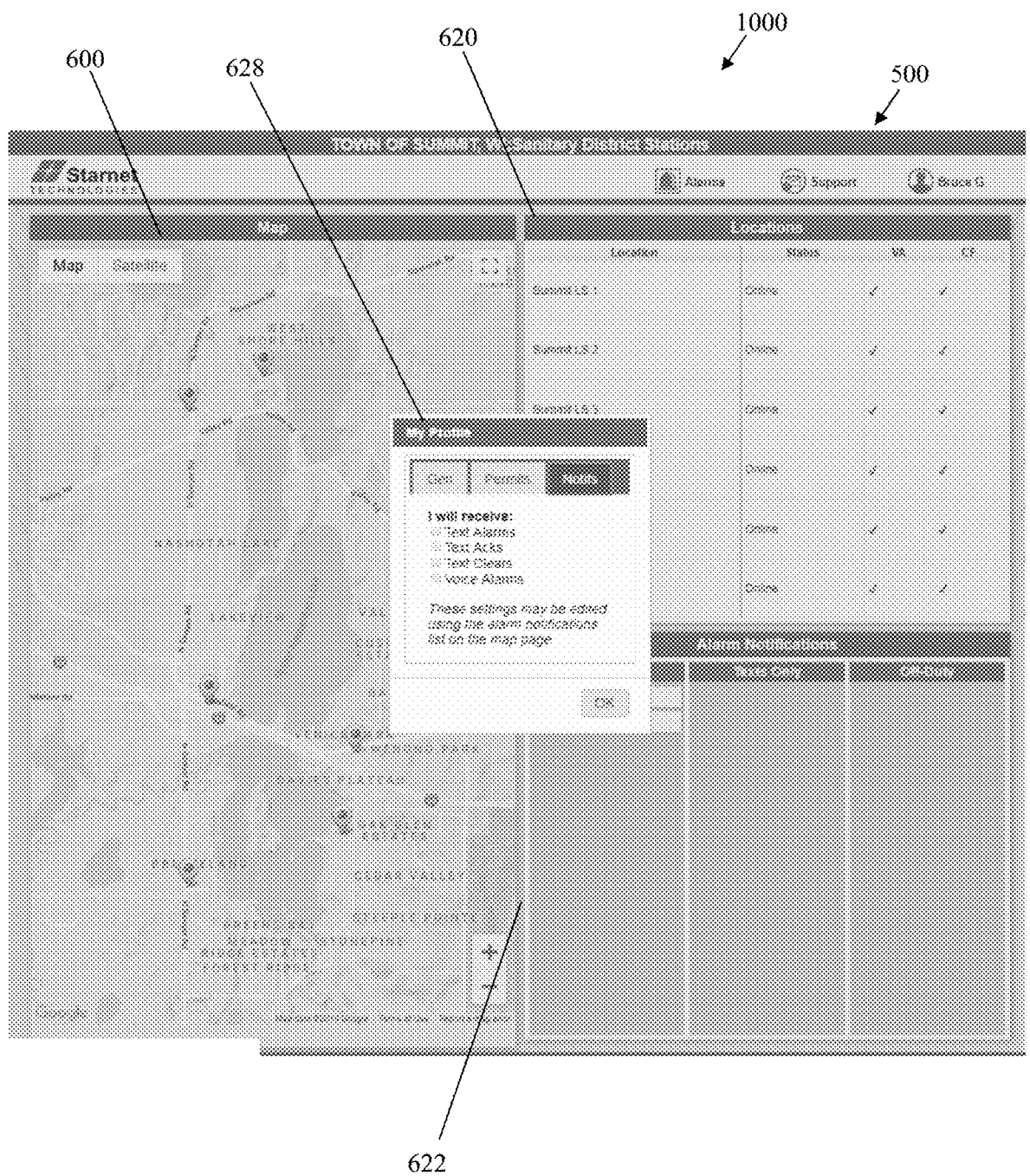
FIG. 20 is a display screen of a computer interface of the system presented that displays a popup window that allows the technician to adjust the notifications they receive from the system.

As an example of the interactive nature of computer interface 500, FIG. 20 shows a popup window 628 that allows the technician to adjust the notifications that they receive from the system 1000, such as text alarms, text acknowledgements, text clears, voice alarms, and the like.

Figure 21:
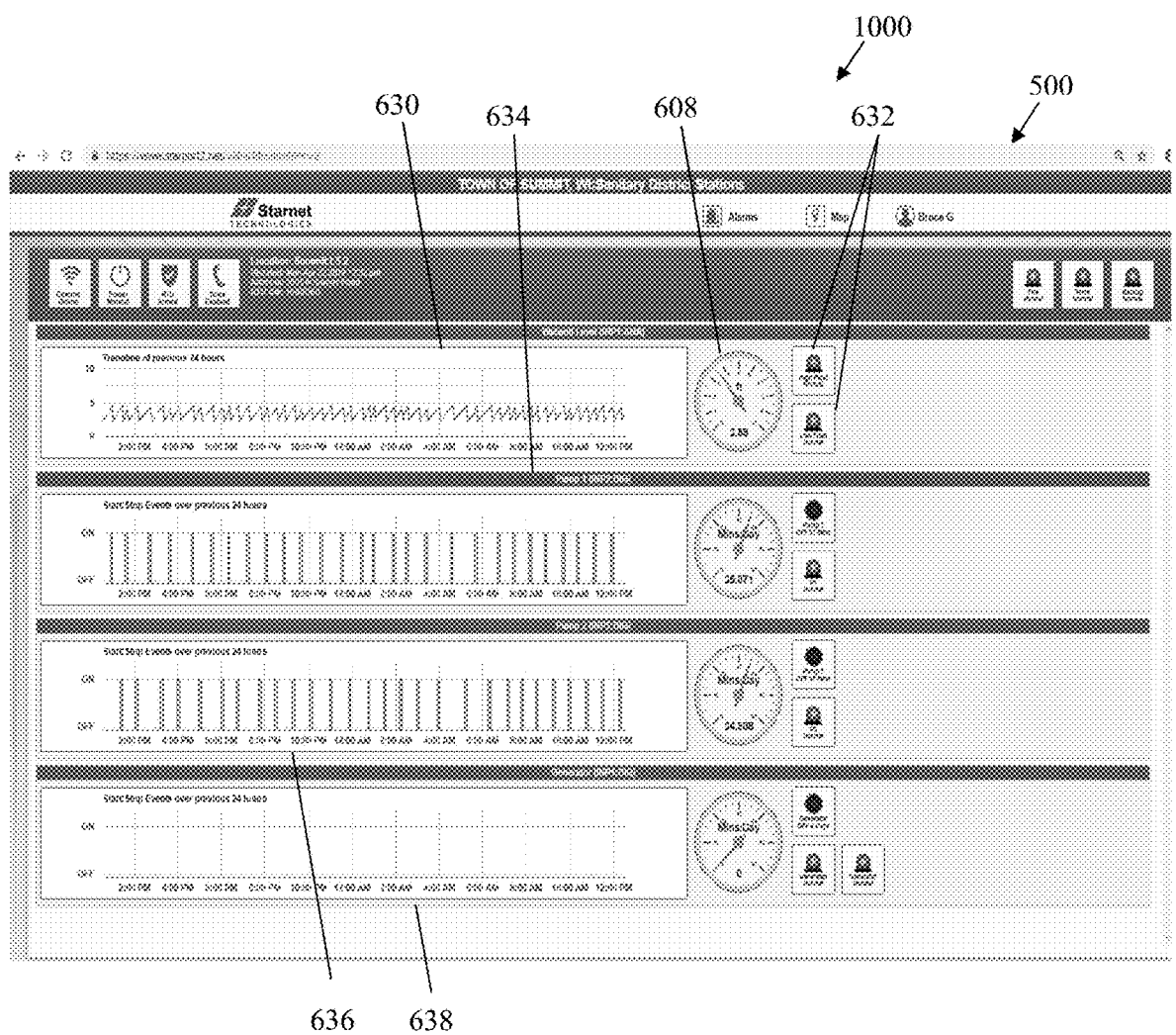
FIG. 21 is a display screen of a computer interface of the system presented that displays a chart of the wetwell level, a chart of the start/stop events of pump 1, a chart of the start/stop events of pump 2, and a chart showing the start/stop of a generator.

FIG. 21 is another interactive display screen of computer interface 500 of system 1000. The view shows a first window 630 that displays the wetwell level over the last 24 hours. This chart shows the trend line charted with time on the X-axis and the depth of fluid on the Y-axis. A gauge 608 is positioned at the right of the window 630 that displays the present depth of the wetwell. A plurality of alarm indicators 632 are positioned at the right of the gauge 608. These alarm indicators 632 that indicate conditions of the system 1000. In the example shown, alarm indicators 632 include a high float level indicator and a low float level indicator. However any other indicator is hereby contemplated for use. These alarm indicators 632 may show the status based on their color, such as no alarm being presented in green and an alarm being presented in red, or flashing red. Any other manner, method or means of indicating the status of the alarms is hereby contemplated for use.

In FIG. 21 a second window 634 is positioned below the first window that presents further information about the system 1000. This second window 634 includes that gauge 608 and alarm indicators 632 described with respect to the first window 630. This second window 634 displays operational characteristics of Pump 1 of the system 1000 and displays the start/stop events over the previous 24 hours with time on the X-axis and on/off on the Y-axis. A third window 636 is presented below the second window 634 that displays this information for Pump 2 of the system 1000. A fourth window 638 is presented below the third window 636 that displays this information for a generator of the system 1000. Any other information may be presented in this computer interface 500 with additional windows.

Figure 22:
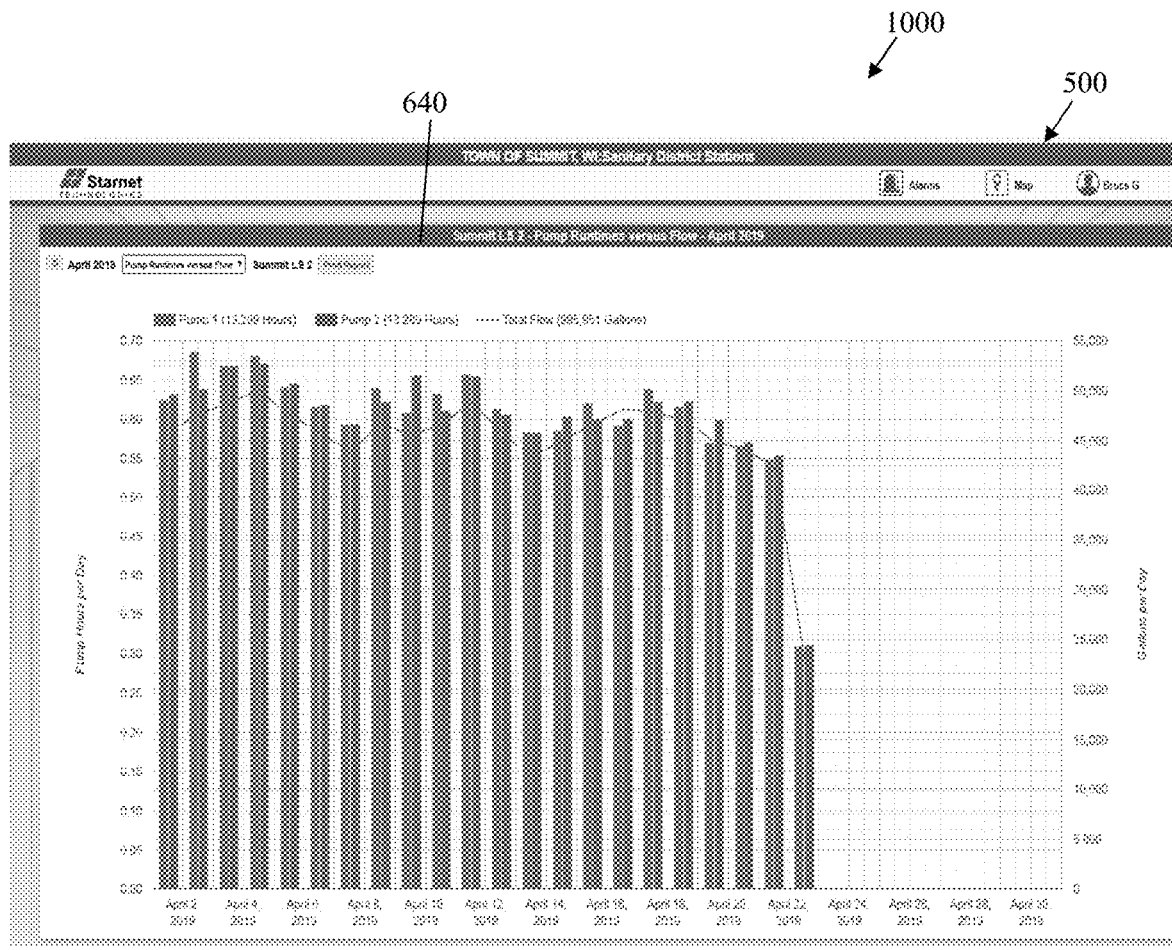
FIG. 22 is a display screen of a computer interface of the system presented that displays a chart having date on the X-axis and pump hours per day on the left-Y-Axis and gallons per day on the right-Y-axis, the chart includes a bar showing Pump 1 and a bar showing Pump 2 on each day as well as a trend line showing the total flow.

FIG. 22 is another interactive display screen of computer interface 500 of system 1000. The view shows a window 640 that displays a chart having date on the X-axis and pump hours per day on the left-Y-Axis and gallons per day on the right-Y-axis. The chart includes a bar showing Pump 1 and a bar showing Pump 2 on each day as well as a trend line showing the total flow.

Figure 23:
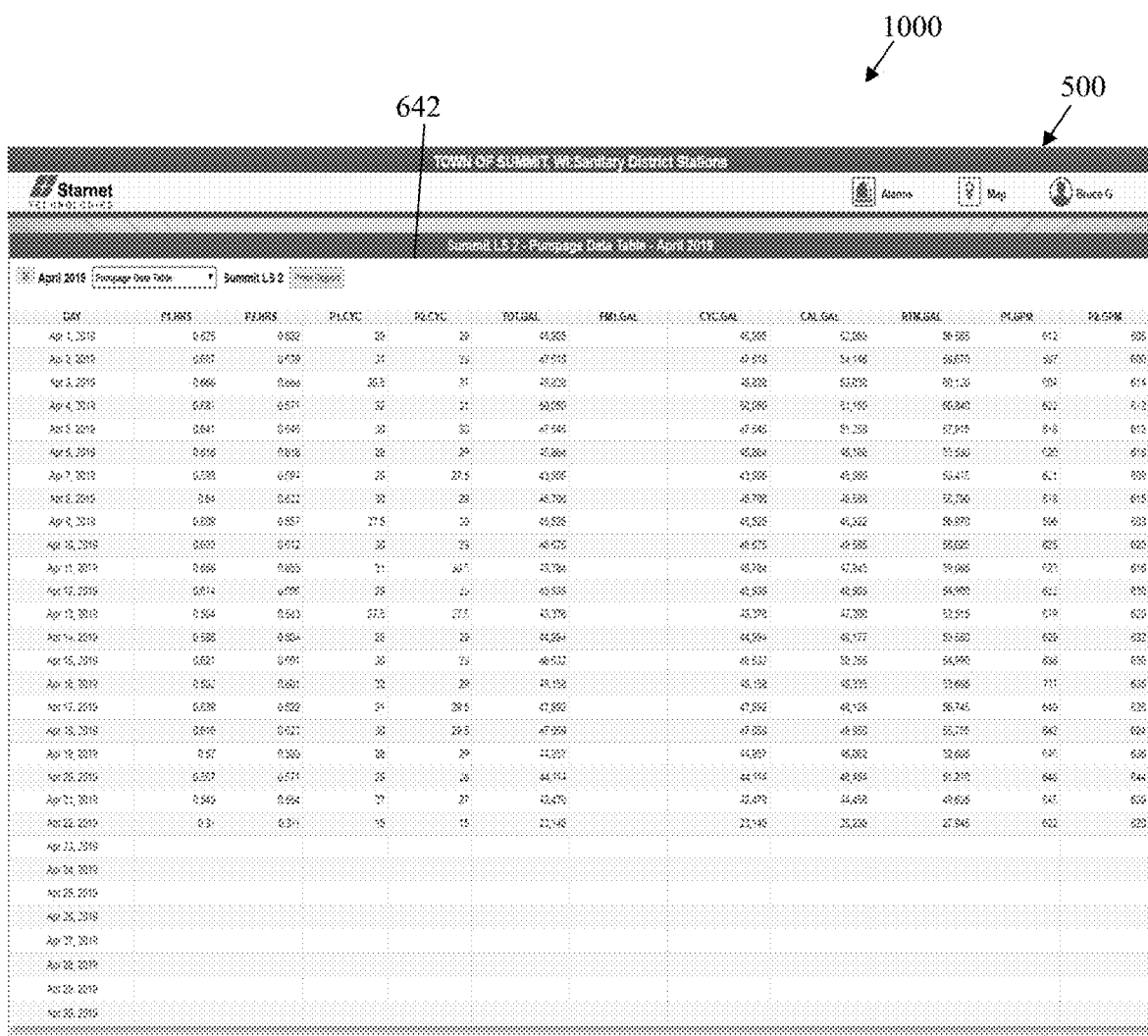
FIG. 23 is a display screen of a computer interface of the system presented that displays a pumpage data table.

FIG. 23 is another interactive display screen of computer interface 500 of system 1000. The view shows a window 642 that displays a pumpage data table that shows columns for days, pump 1 hours, pump 2 hours, pump 1 cycles, pump 2 cycles, total gallons, gallons per cycle, pump 1 gallons per minute, pump 2 gallons per minute, among any other desirable information.

Figure 24:
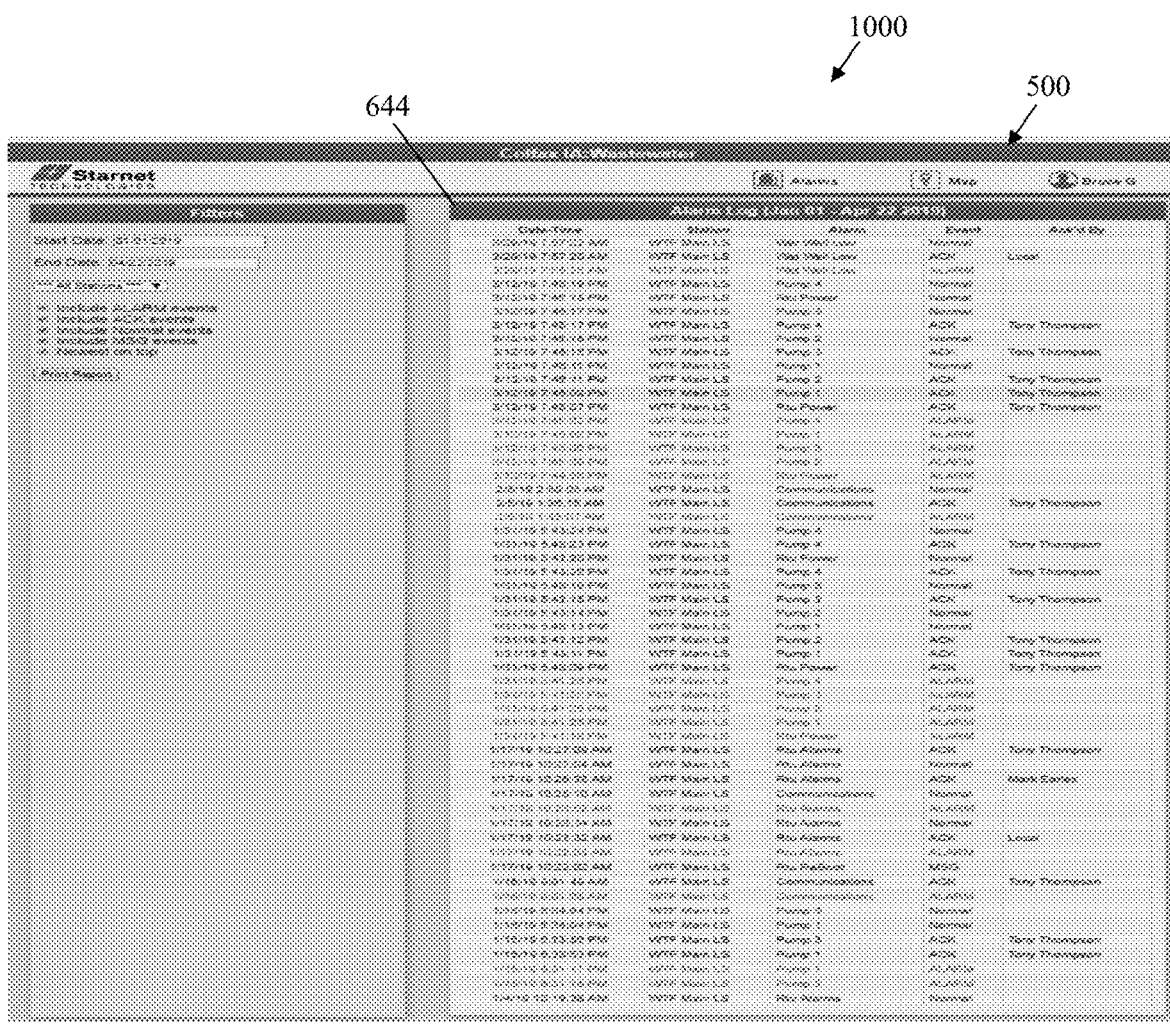
FIG. 24 is a display screen of a computer interface of the system presented that displays an alarm log.

FIG. 24 is another interactive display screen of computer interface 500 of system 1000. The view shows a window 644 that displays an alarm log that shows all alarms received by the system 1000 in chronological order. This log includes the date and time, the station, the alarm type, the event and whether and who it was acknowledged by. FIG. 25 shows a close-up view of the log of window 644, the view showing an "Rtu Alarms" being issued when a power failure occurs which is sensed by sensor 78 and a signal is transmitted to inform the other components of the system 1000 that the RTU 70 and pump 200 are experiencing a power failure. This view shows the "Rtu Alarms" being acknowledged by the technician. This view shows a "Normal" alarm being transmitted shortly after that initial alarm is transmitted and shortly after the alarm is acknowledged by the technician. As can be appreciated, the interactive displays of computer interface 500 presented herein provide substantial advantages as information regarding the system 1000 is quickly presented in an easily understood manner. Any additional information may be presented and this information may be organized in any other manner.

Though not shown in either FIGS. 10 and/or 11, the systems 2000 and 3000 may include additional equipment. For example, in FIGS. 10 and/or 11 the systems 2000, 3000 may further include a backup computer configured to receive data from the plurality of RTUs 70-1, 70-2, 70-3, 70-4, 70-5, 70-6, and 70-7. As one skilled in the art would readily appreciate, there are times the computer master unit 400 may go offline, for example, in the event of a power outage or for maintenance. However, the RTUs 70-1, 70-2, 70-3, 70-4, 70-5, 70-6, and 70-7 may only be capable of sending error messages during a short period of time due to their backup power systems being capacitor based. As such, the systems 2000 and 3000 may include a backup computer configured to receive error information from the RTUs 70-1, 70-2, 70-3, 70-4, 70-5, 70-6, and 70-7. In this embodiment, when the computer master unit 400 goes online, it may poll the backup computer to see if any error messages were received, and, if so, report the error messages to the cloud server. In the alternative, the backup server may simply report the error messages directly to the cloud server.

In example embodiments, the cloud 204 server may execute the operations of FIGS. 2 and 3 and therefore may be capable of managing error messages received from the RTUs 70. For example, in the event an RTU 70 sends a message indicating their respective pump 200 is not receiving power, the cloud 204 server may send an alert to a receiver so the receiver can inspect the pump 200. In addition, the cloud 204 server may update the manner in which the RTU's 70 respective icon is displayed. For example, the cloud 204 server may cause the respective icon to show in red or in flashing red when an error message is received indicating that an error has occurred and servicing is needed.

In Operation: As one example of how the system 1000 presented herein operates, pumps 200 with associated RTUs 70 are installed at each house 106 throughout a neighborhood, such as that presented in the map 600. RTUs 70 and pumps 200 may also be installed at other points in the system, such as at lift stations, pump houses 108, or the like. These RTUs 70 are electrically connected to and/or electrically integrated with their associated pump 200 and run off of the same power source as their associated pump 200. These RTUs 70 include one or more capacitors (C1, C2, C3 and/or C4 and the like) that provide power when a power failure is sensed by sensor 78 by the RTU 70 so as to provide enough power for the RTU 70 to transmit a power failure signal to a computer master unit 400, to another RTU 70, to a cell tower 202, and/or to a server in the cloud 204 or over the internet or to any other electronic component associated with the system 1000. Because capacitors (C1, C2, C3 and/or C4 and the like) are used to provide power in the event of a power fail, the PCB 100 of the RTUs 70 may be installed in a sealed housing 102, such as a air tight and water tight NEMA box because the capacitors (C1, C2, C3 and/or C4 and the like) do not off gas like batteries do which provides sealed protection to the components of the RTU 70. In addition, because the capacitors do not need to be replaced or maintained in the same manner as batteries, and because the capacitors (C1, C2, C3 and/or C4 and the like) do not off gas like batteries, the components of the PCB 100 and/or housing 102 (including capacitors (C1, C2, C3 and/or C4 and the like)) may be coated and/or sealed by and/or encapsulated within a silica and/or another potting compound, which provides increased environmental protection to moisture, dust, dirt and corrosion.

Once the RTUs 70 and pumps 200 are installed, the RTUs 70 establish wireless communications with computer master unit 400 and computer master unit 400 establishes wireless communications with cell tower 202 which establishes electronic communications with the internet and/or the cloud 204 which establishes communications with computer interface 500. In one arrangement, the RTUs 70 establish wireless communications with one another, thereby forming a mesh network, which provides an enhanced ability to get information through a wireless network. Alternatively, computer master unit 400 and/or any of or all of the RTUs 70 may also be or may be in addition directly connected to the internet through a wired connection and/or by any other means such as through a gateway, a Wi-Fi hotspot, a router, a network switch, or by any other manner, method or means.

Once the wired and/or wireless connections are established, during operation RTUs 70 track information related to their associated pump 200 including when they turn on, when they turn off, how many cycles a day they perform, how long they operate for during each cycle, the amount of flow through the pump 200, and any other relevant information. Periodically the RTUs 70 transmit this information to either directly to the cloud 204 through their own connection to the internet or to computer master unit 400 and/or through the mesh network. This information is then transmitted by computer master unit 400 to the internet to the server in the cloud 204 through cellular tower 202 or through its own connection to the internet. This information is eventually displayed on the computer interface 500 of a receiver 90 of a technician which may be any electronic device such as a cell phone, a laptop computer, a tablet computer, a desktop computer or any other electronic device or electronic devices. In one arrangement, computer interface 500 displays, a dashboard for system 1000, which in one arrangement is what is shown in FIG. 12, including an interactive map 600 showing the location and status of each RTU 70 and pump 200, a table of addresses in a window 602, a plurality of gauges 608 shown in a second window 640 and a pie chart shown in a third window 606 among other information.

This information presented in FIG. 12 is periodically used by a technician, a city or county engineer or manager, a housing association foreman or any other person tasked with monitoring the health of the sewage pumping system 1000 of the neighborhood. This technician would periodically use this computer interface 500, and all of the information available through the computer interface 500 to manage the pumping system, to determine when on-sight inspections and/or maintenance are required, determine when repairs are required, or for any other purpose.

During use, RTUs 70 continue to power capacitors (C1, C2, C3, C4 and/or the like) and monitor the inflow of power through a sensor 78 or sensor system 78. In the event that a power failure occurs, while the use of capacitors (C1, C2, C3, C4 and/or the like) provide a number of advantages, the use of capacitors (C1, C2, C3, C4 and/or the like) can only provide power for a very limited amount of time. As such, as soon as, or within a reasonable amount of time after, a power failure is detected or sensed by sensor 78 and/or sensor system 78, RTU 70 transmits a power-failure signal throughout the system 1000 indicating that it has lost power and will momentarily be off line unless power is reestablished. The temporary power provided by capacitors (C1, C2, C3, C4 and/or the like) provides power for the transmission of this power-failure signal after the power has been lost. Without the power provided by capacitors (C1, C2, C3, C4 and/or the like) the RTU 70 would not have the power to transmit this power-failure signal (as power has been lost to the pump 200 and RTU 70 at the time the power-failure signal is sent. This power-failure signal is received by the internet through a direct or indirect connection between RTU 70 and the internet, by computer master unit 400, by the server in the cloud 204, by another RTU 70 in the system 100 through a mesh network, by computer interface 500 and/or any other component of the system 1000. This power-failure signal is logged and an "alarm start" delay timer is initiated by the server in the cloud or any other component of the system 1000.

As soon as power is restored to the RTU 70, and capacitors (C1, C2, C3, C4, etc.) are charged, and communications are re-established, RTU 70 transmits a power-up signal. This power-up signal is received by the internet through a direct or indirect connection between RTU 70 and the internet, by computer master unit 400, by the server in the cloud 204, by another RTU 70 in the system 100 through a mesh network, by computer interface 500 and/or any other component of the system 1000. This power-up signal is logged and in some cases a "power-up" delay timer is initiated by the server in the cloud 204 or any other component of the system 1000. As soon as this power-up signal is received, and any associated delay timer expires, any failure state that has been initiated is cancelled as the RTU 70 is back on line and is operational.

As soon as a power-failure signal is received by computer master unit 400, cloud 204 server and/or computer interface 500 or any other component of the system 1000, a delay timer is initiated. If another communication is not received within the amount of time that the delay timer is set for, then an error message is sent throughout the system 1000 to directly to the technician. That is, the power-failure state is confirmed for the RTU 70 when a power-up signal is not received within the predetermined amount of time set by the delay timer. In one arrangement, the particular RTU 70 and pump 200 are indicated in an error state on map 600, such as marking their location with a red emblem, a flashing emblem, or the like. In one arrangement, a message is sent to the owner of the property and/or to the technician that manages the RTU 70 and pump 200 system, which may be an email, a text message to a user's cell phone, a voice mail, an automated phone call and/or any other communication or combination thereof. Upon receiving this message, the technician can review the overall system 1000 as well as the particular RTU 70 and pump 200 and determine how to respond. The technician can easily compare the particular RTU 70 and pump 200 to the other components of the system 1000 such as other RTUs 70 and pumps 200. This may include calling the property owner to alert them to the condition, ask them for their opinion or to determine what they know, this may include making an on-site visit for repairs, this may include waiting for further information, or any other response. Providing this accurate and early information about a power failure at an RTU 70 and pump 200 can help avoid catastrophic events, such as the backup of sewage.

In view of the above, while the use of capacitors (C1, C2, C3, C4 and/or the like) have their draw backs, such as short periods of time that they can provide additional power, the use of capacitors in RTUs 70 with pump 200 have substantial advantages. Namely, the RTUs 70 require less maintenance as compared to batteries, the RTUs 70 have a longer useful life, the RTUs 70 are more durable, the RTUs 70 may be sealed in a silica potting compound, the RTUs 70 may be held within a sealed and non-venting housing 102, and the capacitors (C1, C2, C3, C4 and/or the like) are less temperature sensitive as compared to batteries, the RTUs 70 are more resistive to water and dirt and dust, among many other advantages. As such the use of an RTU 70 having a capacitor based power backup provides increased life, improved efficiencies, less cost, greater accuracy, less catastrophic failures, more protection, among countless other advantages.

Residential & Commercial Applications: There are two different applications for the technology presented herein, residential and commercial. The needs between residential and commercial applications are similar, but they differ.

Residential Applications: Residential applications require substantial attention and minimal cost. This is because residential owners are very cost sensitive. In addition, in residential applications, there tends to be a high density of pumps 200 in a small geographic area, as such the cost per pump 200 and RTU 70 is very important. That is, in a residential application, there tends to be one pump 200 associated with each house 106. With some housing developments having hundreds or thousands of houses 106, saving a few cents or a few dollars per house 106 has substantial overall cost savings for the developer, builder, homeowner and/or housing association and the like. Despite the extreme cost sensitivity, the pumps 200 must operate flawlessly as a failure can be catastrophic and a failure of one pump 200 at one house 106 can cause damage across a great number of houses 106

In addition, when hundreds or thousands of remote telemetry units 70 are installed (one with each pump 200), changing the batteries out of all of the RTUs 70 is a substantially involved, complex and expensive task which is all but impossible to efficiently execute. One advantage to residential applications is that the houses 106 tend to be in close proximity to one another and as such the RTUs 70 associated with each house 106 are close enough to one another that they may communicate with one another and/or with computer master unit 400 with close range wireless communication protocols such as a mesh network, Wi-Fi, Bluetooth, and/or the like. Also, in the arrangement wherein the house 106 has a wireless and/or wired connection to the internet, RTUs 70 may connect directly to the internet through this internet connection, either by wireless and/or wired communication. This avoids the need, and the complexity and expense, of having a cellular communications module associated with the RTUs 70. However, in one arrangement it is hereby contemplated that the communication module of the RTU 70 is itself a cellular communication module which enables direct communication between the RTU 70 and cellular tower 202 which provides greater range and allows for direct communication with cellular tower 202 and avoids communication issues that may come with communicating with middle-men such as other RTUs 70, computer master unit 400 and the like.

In some applications, to provide redundancy and optionality, remote telemetry unit 70 in a residential application may have multiple communication capabilities such as being able to communicate over a plurality of protocols and wavelengths such as mesh network, Wi-Fi and/or Bluetooth and/or cellular, and/or RF (such as 433 Mhz), and the like. To provide even further redundancy and optionality, remote telemetry unit 70 in a residential application may have multiple communication capabilities such as being able to communicate over a plurality of protocols and wavelengths such as mesh network, Wi-Fi and/or Bluetooth, and/or RF (such as 433 Mhz), and the like as well as have a cellular enabled communication module capable of communicating directly with cellular tower 202.

One complexity related to residential applications is that the wastewater systems of multiple houses 106 may be connected and/or interconnected to one another or dependent upon one another. That is, in some residential developments, if the pump 200 of one house 106 fails or goes down, this can cause a backup in multiple upstream and/or downstream houses 106 (depending on the arrangement). Said another way, the wastewater handling systems of many housing developments are only as robust as the weakest link in the chain and portions of the housing development can fall like dominos if one pump 200 goes out. As such, avoidable failures cannot be tolerated.

As one example of use, with reference to FIG. 8, a remote telemetry unit 70 is connected to a pump 200 housed within a pit 300 that is associated with a house 106 in a housing development. Waste water 350 is received from the house 106, and in some cases other upstream houses 106 in the housing development, through input 360. A pump 200 is positioned within the pit 300 that pumps the wastewater 350 out of pit 300 through output 370, which in some applications goes to a central repository, a central lift station, a sewage treatment facility or another high capacity component of the system 1000. However, in other applications, the output 370 of one house 106 becomes an input 360 to the pit 300 of another house 106. In the arrangement shown, in this residential application, the housing 102 containing the RTU 70 is electrically connected to the pump 200 and is attached to the exterior wall of the house 106 and is powered by the same power source as the pump 200. In one arrangement, these housings 102 include a beacon light 104, such that when an error or fault occurs with the pump 200, the beacon light 104 illuminates or flashes. This system is largely ineffective because residents of the house 106 are largely unable to notice whether the bacon light 104 is illuminated/flashing due to its position of the housing 102 on the outside of the house 106 and the tendency for the builder to hide these housings 102 in inconspicuous places. Going a step further, as most homeowners are unaware of their sump pump, low pressure sewer pump, grinder pump or the like, until it backs up into their house 106, even if the homeowner is aware of the illuminated/flashing beacon light 104, often they do not know what that flashing beacon means and they tend to ignore the flashing light. In addition, in a power fail situation, the beacon light 104 is only able to illuminate/flash so long as the batteries hold a charge (which have many weaknesses as is described herein such as a short life, temperature sensitivity, and the like).

To alleviate these problems, the housing 102 includes an RTU 70 with capacitors (C1, C2, C3 and C4 and the like) as is described herein that wirelessly communicates when an error or fault or power-failure occurs. That is, the electronic components of the system 1000, such as the RTU 70 include one or more sensors 78 that have the ability to sense when a fault occurs with the pump 200, such as the pump 200 stops working, ceases-up, or encounters any other error and the RTU 70 transmits an error or fault signal through the system. In one arrangement, RTU 70 communicates directly with pump 200 and through this communication RTU receives information regarding failures as well as operational characteristics of pump 200. Similarly, the electronic components of the system, such as the RTU 70 include the ability to sense when a when a power fail occurs through sensor system 78 and the RTU 70 transmits a power failure signal through the system 1000. A wireless signal may be transmitted directly to the computer master unit 400 through wireless communication, such as through any wireless protocol such as Z-Wave, ZigBee, a mesh network protocol, Wi-Fi, Bluetooth, an RF protocol, or the like. Or, alternatively, a wireless signal may be transmitted through a mesh network of interconnected pumps 200 and RTUs 70 of the houses 106 of the housing development until the signal gets to the computer master unit 400, or alternatively to the internet or the server in the cloud 204. Once this signal is received, the signal is processed in the manner described herein. If it is an error message, such as a ceased pump 200, a signal is transmitted through the system 1000 to a maintenance technician in charge of the system of interconnected pumps 200 and RTUs 70, such as through display on computer interface 500, or through a voice message, a text message, an alert on an application associated with the system, an email or by any other manner method or means.

Similarly, if the message is a power failure message, upon receiving the message, the system begins the delay timer, as is described herein, and a power failure message is transmitted if no power-up signal is received by the system within the predetermined amount of time of the delay timer at which point the power failure message is transmitted. In this way, the error message and/or power failure message is transmitted directly to a maintenance technician, homeowner and/or any other party that has the knowledge to manage the system 1000 of pumps 200 and knows how to react in a much faster amount of time, as opposed to providing the homeowner with this information. In this way, problems may be addressed in a faster period of time with more information and less cost with less potential for damage to be done to the house 106 or houses 106. In one arrangement, to provide yet another way of indicating that an error has occurred, the housing 102 that includes an RTU 70 also includes a beacon light 104 that illuminates when an error occurs. This arrangement allows for an error message to be wirelessly transmitted at the same time or shortly after (to preserve capacitor charge) a wireless error signal is transmitted.

In a residential applications, the pumps 200 tend to be low cost and cheap pumps. Examples of residential pumps include low-flow sump pumps, low pressure sewage pumps, grinder pumps or the like. Due to their inexpensive construction and their limited capacity, these residential pumps tend to fail substantially more-often than commercial pumps, which makes providing an alert when an error or power fail occurs even more important. In contrast, commercial pumps 200 tend to be much more expensive, higher flow pumps with substantially fewer errors.

It is very beneficial in residential applications, due to the number of houses 106, and therefore the number of housings 102, to have these systems include capacitors (C1, C2, C3, C4) to provide backup power. This eliminates the need to replace batteries across a great number of houses 106.

Commercial Applications: Commercial applications differ from residential applications in that commercial applications tend to be stand-alone installations. That is, commercial pumps 200 are often not surrounded by a plurality of other pumps 200 that allow for close range wireless communication between the pumps 200 and/or RTUs 70 using Z-Wave, ZigBee, a mesh network protocol, Wi-Fi, Bluetooth, or the like. In contrast, commercial applications tend to be stand-alone units that are often in the middle of undeveloped land, or within an industrial park or in an urban environment. These commercial applications also tend to be housed within a pump house 108 and use much higher and much costlier pumps 200 that tend to fail less often than residential pumps, however when they do fail it is often as much greater consequence and cost as compared to residential failures. Due to the isolated nature of these commercial applications, RTUs 70 and housings 102 tend to include a cellular module that facilitates wireless communication directly with a cellular tower 202 in the event of a fault or power failure. The cost of adding a cellular module to these commercial applications is justified as there tend to be less RTUs 70 commercial applications than there is in a residential application. In addition, due to the geographic isolation of these commercial applications, the longer range afforded by using a cellular module is needed to connect with cellular tower 202. In one arrangement, in contrast to residential applications, wherein the housing 102 is connected to the exterior of the house 106, the housing 102 may be sealed and contained within the pump house 108. In one arrangement, as the addition of the cellular module to the RTU 70 additional capacitors are added to provide additional power to power the cellular module and RTU 70 (which tend to consume more power and take longer to communicate than close range radio communications of residential applications).

Example embodiments of the disclosure have been described in an illustrative manner. It is to be understood that the terminology that has been used is intended to be in the nature of words of description rather than of limitation. Many modifications and variations of example embodiments are possible in light of the above teachings. Therefore, within the scope of the appended claims, the present disclosure may be practiced otherwise than as specifically described.

I claim:

1. A method for monitoring the operation of a system of a plurality of pumps, the steps comprising:
   providing a plurality of remote telemetry units (RTUs) with at least one associated pump, wherein the RTUs are configured to detect power failures and have at least one capacitor configured to provide temporary power to the RTU when power failures occur;
   wirelessly connecting the plurality of RTUs to a computer system;
   detecting a power failure by a first RTU;
   powering the first RTU using at least one capacitor for a temporary period of time;
   transmitting a power failure signal by the first RTU to the computer system after the power failure is detected by the first RTU;
   setting a delay timer by the computer system in response to receiving the power failure signal from the first RTU;
   indicating the first RTU is in a power failure state if a power-up signal is not received by the computer system within an amount of time set by the delay timer.

2. The method of claim 1, wherein the first RTU is configured to detect the power failure using a sensor.

3. The method of claim 1, wherein the at least one capacitor of the first RTU is housed within a sealed housing.

4. The method of claim 1, wherein the first RTU is configured to detect the power failure using a sensor, wherein the sensor of the first RTU is housed within a sealed housing.

5. The method of claim 1, wherein the at least one capacitor of the first RTU is sealed in a potting compound.

6. The method of claim 1, wherein the first RTU is configured to detect the power failure using a sensor, wherein the sensor of the first RTU is sealed in a potting compound.

7. The method of claim 1, wherein the plurality of RTUs are displayed on an interactive map.

8. The method of claim 1, wherein the computer system is a cloud based server.

9. The method of claim 1, wherein the computer system is a computer master unit which is part of a mesh network within wireless communication range of the plurality of RTUs.

10. The method of claim 1, wherein the computer system is connected to a cellular tower.

11. The method of claim 1, wherein the computer system is connected to a cloud based server.

12. The method of claim 1, wherein the computer system is connected to a computer interface which is reviewed by a technician that monitors the system.

13. The method of claim 1, wherein the power failure state is confirmed for the first RTU when a power-up signal is not received within a predetermined amount of time set by the delay timer and the power failure signal is transmitted to a technician that monitors the system.

14. The method of claim 1, wherein the power failure state is confirmed for the first RTU when a power-up signal is not received within a predetermined amount of time set by the delay timer and the power failure signal is displayed on a computer interface on an interactive map to a technician that monitors the system.

15. A communication system for indicating a failure state of a pump, the system comprising: the pump; a remote telemetry unit (RTU) electrically connected to the pump; the RTU configured to detect a power failure; the RTU having a power backup system having at least one capacitor, wherein the power backup system is configured to provide temporary power to the RTU when a power failure is detected by the RTU; the RTU having a communication module including an antenna that is configured to transmit signals regarding condition of the RTU; a computer system configured to receive signals from the RTU indicating a present condition of the RTU; wherein the computer system is configured to send out an alert when a failure state is confirmed at the pump; and wherein the computer system is configured to initiated a delay timer if a present signal received from the TRU indicates a condition of the RTU is FAILED.

16. The system of claim 15, further comprising the RTU having a sensor configured to detect the power failure.

17. The system of claim 15, further comprising the RTU having a constant current charging system configured to charge the at least one capacitor of the power backup system.

18. The system of claim 15, wherein the computer system indicates a FAILED condition to a receiver monitored by a technician when a FAILED signal is received by the computer system and a GOOD signal is not received within a period of time set by a delay timer initiated in response to the FAILED signal being received.

19. The system of claim 15, wherein the computer system is configured to initiate the delay timer if the signal indicates a condition of the remote telemetry unit is FAILED and the previously recorded condition was GOOD.

20. The system of claim 15, wherein the RTU is arranged in a sealed structure.

21. The system of claim 15, wherein the power backup system of the RTU is entirely within a sealed structure.

22. A communication system for indicating a failure state of a pump, the system comprising: a remote telemetry unit (RTU) electrically connected to the pump; the RTU configured to detect power failures; the RTU having a power backup system having at least one capacitor, wherein the power backup system is configured to provide temporary power to the RTU when a power failure is detected by the RTU; the RTU having a communication module including an antenna that is configured to transmit signals regarding the condition of the RTU; a computer system configured to receive signals from the RTU indicating a present condition of the RTU; in the computer system is configured to send out an alert when a failure state is confirmed at the pump; and wherein the computer system is configured to indicate the RTU is in a FAILED condition if the computer system receives a FAILED signal from the RTU and the computer system does not receive a GOOD signal from the RTU within an amount of time set by a delay timer initiated by the computer system.

23. A communication system for indicating a failure state of a pump, the system comprising: a remote telemetry unit (RTU) electrically connected to the pump; the RTU configured to detect power failures; the RTU having a communication module including an antenna that is configured to transmit signals regarding the condition of the RTU; the RTU including a power backup system having at least one capacitor; the RTU, including the power backup system having at least one capacitor, positioned within a sealed housing; wherein when the RTU detects a power failure has occurred the at least one capacitor of the power backup system provides temporary power to the RTU; wherein when the power failure occurs and the at least one capacitor of the power backup system provides temporary power to the RTU, the RTU transmits a power failure signal to a computer system that is configured to monitor the status of the RTU; wherein when the computer system that is configured to monitor the status of the RTU receives the power failure signal from the RTU, the computer system initiates a power failure delay timer and the computer system confirms a power failure at the pump if a power up signal is not received within a delay period of the power failure delay timer.

24. The system of claim 23, further comprising the RTU having a sensor configured to detect the power failure.

25. The system of claim 23, wherein the at least one capacitor of the power backup system is sealed within a potting compound.

26. The system of claim 23, wherein the computer system configured to monitor the status of the RTU is a computer master unit.

27. The system of claim 23, wherein the computer system configured to monitor the status of the RTU is a server in the cloud.

28. A communication system for indicating a failure state of a pump, the system comprising: the pump; a remote telemetry unit (RTU) electrically connected to the pump; the RTU configured to detect power failures; the RTU having a communication module including an antenna that is configured to transmit signals regarding the condition of the RTU; the RTU including a power backup system having at least one capacitor; the RTU, including the power backup system having at least one capacitor, sealed within a porting compound; wherein when the RTU detects a power failure has occurred the at least one capacitor of the power backup system provides temporary power to the RTU; wherein when the power failure occurs and the at least one capacitor of the power backup system provides temporary power to the RTU, the RTU transmits a power failure signal to a computer system that is configured to monitor the status of the RTU; wherein when the computer system that is configured to monitor the status of the RTU receives the power failure signal from the RTU, the computer system initiates a power failure delay timer and the computer system confirms a power failure at the pump if a power up signal is not received within a delay period of the power failure delay timer.

29. The system of claim 28, further comprising the RTU having a sensor configured to detect the power failure.

30. The system of claim 28, wherein the at least one capacitor of the power backup system is sealed within the potting compound.

31. The system of claim 28, wherein the computer system configured to monitor the status of the RTU is a computer master unit.

32. The system of claim 28, wherein the computer system configured to monitor the status of the RTU is a server in the cloud.

33. A communication system for indicating a failure state of a pump, the system comprising: the pump a remote telemetry unit (RTU) electrically connected to the pump; the RTU configured to detect power failures; the RTU having a power backup system having at least one capacitor, wherein the power backup system is configured to provide temporary power to the RTU when a power failure is detected by the RTU; the RTU having a communication module including an antenna that is configured to transmit signals regarding condition of the RTU; a computer system configured to receive signals from the RTU indicating a present condition of the RTU; wherein the computer system is configured to send out an alert when a failure state is confirmed at the pump; and wherein the computer system is configured to initiate a delay timer if a signal received from the RTU indicates the RTU is in a FAILED condition.

34. The system of claim 33, wherein the computer system is configured to initiate the delay timer if the signal indicates the RTU is in the FAILED condition and the RTU was previously recorded in a GOOD condition.

* * * * *

UNITED STATES PATENT AND TRADEMARK OFFICE
CERTIFICATE OF CORRECTION

PATENT NO. : 10,880,155 B2  
APPLICATION NO. : 16/412655  
DATED : December 29, 2020  
INVENTOR(S) : Bruce Grindeland Page 1 of 2

It is certified that error appears in the above-identified patent and that said Letters Patent is hereby corrected as shown below:

In the Claims

Claim 15 should read as follows:
15. A communication system for indicating a failure state of a pump, the system comprising: the pump; a remote telemetry unit (RTU) electrically connected to the pump; the RTU configured to detect a power failure; the RTU having a power backup system having at least one capacitor, wherein the power backup system is configured to provide temporary power to the RTU when a power failure is detected by the RTU; the RTU having a communication module including an antenna that is configured to transmit signals regarding condition of the RTU; a computer system configured to receive signals from the RTU indicating a present condition of the RTU; wherein the computer system is configured to send out an alert when a failure state is confirmed at the pump; and wherein the computer system is configured to initiate a delay timer if a present signal received from the RTU indicates a condition of the RTU is FAILED.

Claim 22 should read as follows:
22. A communication system for indicating a failure state of a pump, the system comprising: a remote telemetry unit (RTU) electrically connected to the pump; the RTU configured to detect power failures; the RTU having a power backup system having at least one capacitor, wherein the power backup system is configured to provide temporary power to the RTU when a power failure is detected by the RTU; the RTU having a communication module including an antenna that is configured to transmit signals regarding the condition of the RTU; a computer system configured to receive signals from the RTU indicating a present condition of the RTU; wherein the computer system is configured to send out an alert when a failure state is confirmed at the pump; and wherein the computer system is configured to indicate the RTU is in a FAILED condition if the computer system receives a FAILED signal from the RTU and the computer system does not receive a GOOD signal from the RTU within an amount of time set by a delay timer initiated by the computer system.

Claim 28 should read as follows:
28. A communication system for indicating a failure state of a pump, the system comprising: the pump; a remote telemetry unit (RTU) electrically connected to the pump; the RTU configured to Signed and Sealed this  
Twenty-third Day of February, 2021

Drew Hirshfeld  
*Performing the Functions and Duties of the  
Under Secretary of Commerce for Intellectual Property and  
Director of the United States Patent and Trademark Office* detect power failures; the RTU having a communication module including an antenna that is configured to transmit signals regarding the condition of the RTU; the RTU including a power backup system having at least one capacitor; the RTU, including the power backup system having at least one capacitor, sealed within a potting compound; wherein when the RTU detects a power failure has occurred the at least one capacitor of the power backup system provides temporary power to the RTU; wherein when the power failure occurs and the at least one capacitor of the power backup system provides temporary power to the RTU, the RTU transmits a power failure signal to a computer system that is configured to monitor the status of the RTU; wherein when the computer system that is configured to monitor the status of the RTU receives the power failure signal from the RTU, the computer system initiates a power failure delay timer and the computer system confirms a power failure at the pump if a power up signal is not received within a delay period of the power failure delay timer.

Claim 33 should read as follows:
33. A communication system for indicating a failure state of a pump, the system comprising: the pump; a remote telemetry unit (RTU) electrically connected to the pump; the RTU configured to detect power failures; the RTU having a power backup system having at least one capacitor, wherein the power backup system is configured to provide temporary power to the RTU when a power failure is detected by the RTU; the RTU having a communication module including an antenna that is configured to transmit signals regarding the condition of the RTU; a computer system configured to receive signals from the RTU indicating a present condition of the RTU; wherein the computer system is configured to send out an alert when a failure state is confirmed at the pump; and wherein the computer system is configured to initiate a delay timer if a signal received from the RTU indicates the RTU is in a FAILED condition.